(12) United States Patent
Kim et al.

(10) Patent No.: US 9,966,369 B2
(45) Date of Patent: May 8, 2018

(54) LIGHT EMITTING DEVICE PACKAGE

(71) Applicant: Samsung Electronics Co., Ltd., Suwon-si (KR)

(72) Inventors: Yong Il Kim, Seoul (KR); Wan Tae Lim, Suwon-si (KR); Young Jin Choi, Seoul (KR); Sung Hyun Sim, Uiwang-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/802,493

(22) Filed: Nov. 3, 2017

(65) Prior Publication Data

US 2018/0068991 A1 Mar. 8, 2018

Related U.S. Application Data

(62) Division of application No. 15/386,425, filed on Dec. 21, 2016, now Pat. No. 9,825,016.

(30) Foreign Application Priority Data

May 17, 2016 (KR) .................. 10-2016-0059941

(51) Int. Cl.
*H01L 25/16* (2006.01)
*H01L 27/12* (2006.01)
(Continued)

(52) U.S. Cl.
CPC .......... *H01L 25/167* (2013.01); *H01L 27/124* (2013.01); *H01L 33/06* (2013.01);
(Continued)

(58) Field of Classification Search
CPC ...... H01L 25/167; H01L 27/124; H01L 33/50
See application file for complete search history.

(56) References Cited

U.S. PATENT DOCUMENTS

| | | |
|---|---|---|
| 5,798,535 A | 8/1998 | Huang et al. |
| 5,893,721 A | 4/1999 | Huang et al. |

(Continued)

FOREIGN PATENT DOCUMENTS

| | | |
|---|---|---|
| JP | 10-144897 A | 5/1998 |
| KR | 10-1469799 B1 | 12/2014 |

*Primary Examiner* — Christine Enad
(74) *Attorney, Agent, or Firm* — Muir Patent Law, PLLC

(57) ABSTRACT

A light emitting device package includes a cell array including a plurality of semiconductor light emitting units, and having a first surface and a second surface opposite the first surface, each of the plurality of semiconductor light emitting units having a first conductive semiconductor layer, an active layer, and a second conductive semiconductor layer stacked on each other. The light emitting device package may further include a plurality of wavelength conversion units disposed on the first surface of the cell array to correspond to the plurality of semiconductor light emitting units, respectively, each configured to convert a wavelength of light, emitted by a respective one of the plurality of semiconductor light emitting units, into a different wavelength of light, and a partition structure disposed in a space between the plurality of wavelength conversion units, and a plurality of switching units spaced apart from the plurality of wavelength conversion units within the partition structure, and electrically connected to the plurality of semiconductor light emitting units.

20 Claims, 39 Drawing Sheets

(51) Int. Cl.
*H01L 33/50* (2010.01)
*H01L 33/32* (2010.01)
*H01L 33/54* (2010.01)
*H01L 33/06* (2010.01)

(52) U.S. Cl.
CPC .............. *H01L 33/32* (2013.01); *H01L 33/50* (2013.01); *H01L 33/54* (2013.01)

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,777,351 B1 | 8/2010 | Berry et al. |
| 7,781,727 B2 | 8/2010 | Sherrer et al. |
| 7,790,482 B2 | 9/2010 | Han et al. |
| 7,791,068 B2 | 9/2010 | Meng et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,989,707 B2 | 8/2011 | Yamano et al. |
| 7,994,525 B2 | 8/2011 | Lee et al. |
| 7,994,626 B2 | 8/2011 | Pendse |
| 8,008,683 B2 | 8/2011 | Choi et al. |
| 8,013,352 B2 | 9/2011 | Lee et al. |
| 8,049,161 B2 | 11/2011 | Sherrer et al. |
| 8,076,765 B2 | 12/2011 | Chen et al. |
| 8,120,242 B2 | 2/2012 | Yokoyama et al. |
| 8,129,711 B2 | 3/2012 | Kang et al. |
| 8,179,938 B2 | 5/2012 | Kim |
| 8,217,502 B2 | 7/2012 | Ko |
| 8,247,894 B2 | 8/2012 | Yoon et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,541,261 B2 | 9/2013 | Kikuchi et al. |
| 8,633,496 B2 | 1/2014 | Hata et al. |
| 8,735,931 B2 | 5/2014 | Han et al. |
| 8,766,295 B2 | 7/2014 | Kim |
| 8,793,868 B2 | 8/2014 | Yamano et al. |
| 8,810,024 B2 | 8/2014 | Lin et al. |
| 9,177,992 B2 | 11/2015 | Blanchard et al. |
| 9,214,644 B2 | 12/2015 | Rinzler et al. |
| 9,220,135 B2 | 12/2015 | Huang et al. |
| 9,343,386 B2 | 5/2016 | Huang et al. |
| 9,570,382 B2 | 2/2017 | Haba et al. |
| 9,666,571 B2 | 5/2017 | Kao et al. |
| 2008/0017968 A1 | 1/2008 | Choi et al. |
| 2012/0086044 A1 | 4/2012 | Hata et al. |
| 2014/0159067 A1 | 6/2014 | Sakariya et al. |
| 2014/0176857 A1* | 6/2014 | Chen .............. G02F 1/133621 349/61 |
| 2015/0279902 A1 | 10/2015 | Von Malm et al. |
| 2015/0287681 A1 | 10/2015 | Soh et al. |
| 2016/0266695 A1* | 9/2016 | Bae .................. G06F 1/1643 |
| 2016/0359089 A1* | 12/2016 | Moon ................ H01L 33/504 |
| 2017/0345866 A1* | 11/2017 | Joo .................... H01L 33/60 |

\* cited by examiner

I-I'

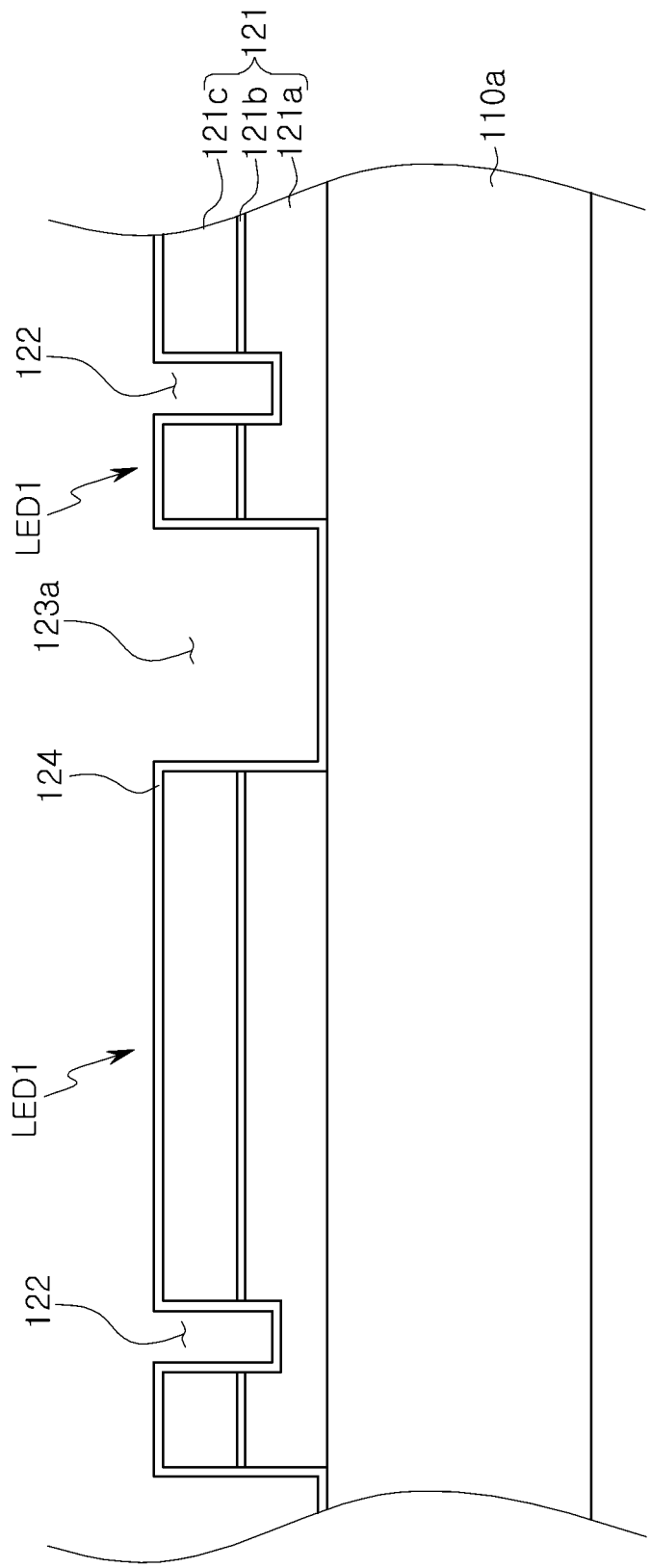

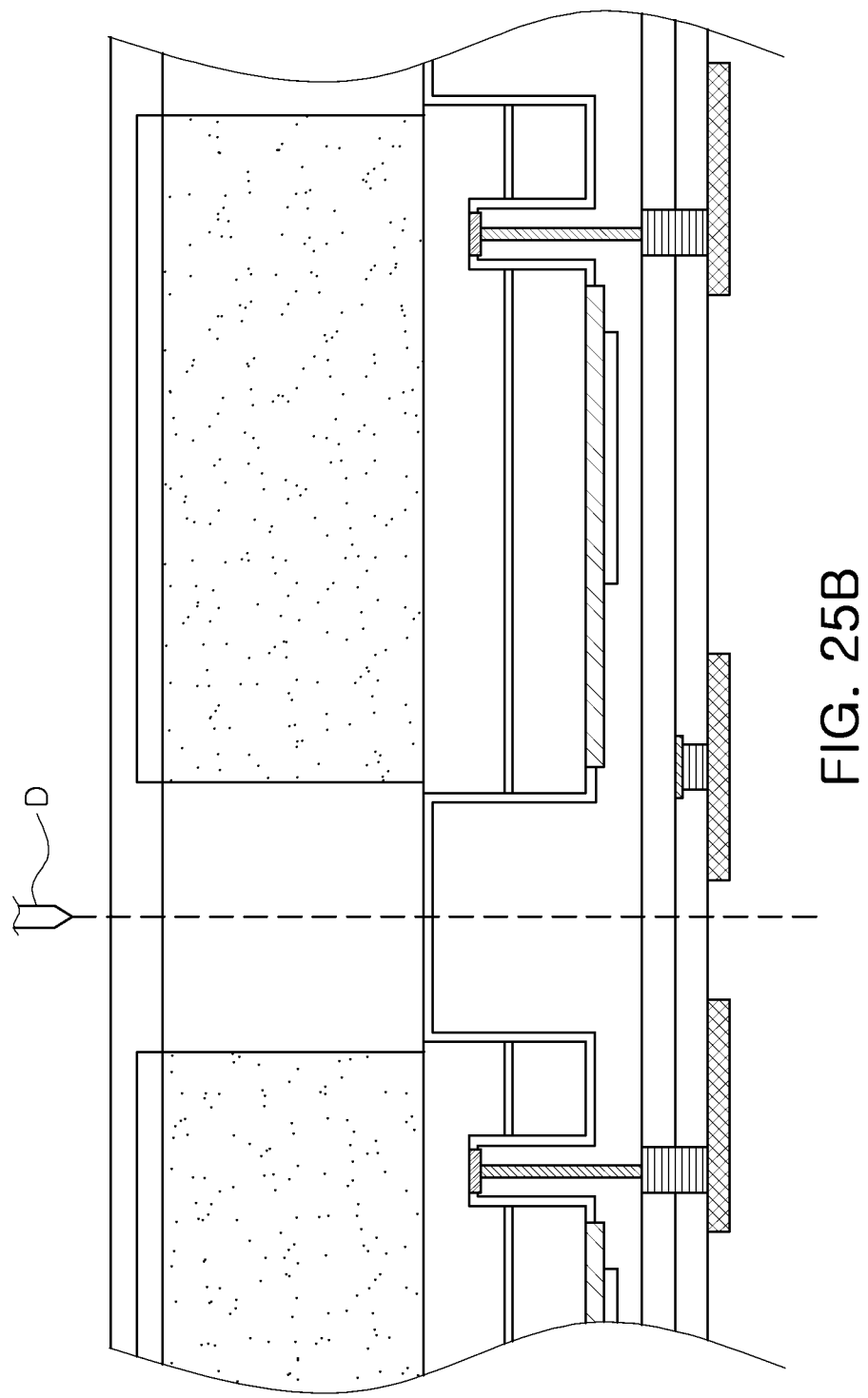

LIGHT EMITTING DEVICE PACKAGE

CROSS-REFERENCE TO RELATED APPLICATION

This application is a Divisional Application of U.S. patent application Ser. No. 15/386,425, filed Dec. 21, 2016, which claims benefit of priority to Korean Patent Application No. 10-2016-0059941, filed on May 17, 2016 with the Korean Intellectual Property Office, the disclosure of each of which is incorporated herein by reference in its entirety.

BACKGROUND

1. Field

The present inventive concept relates to alight emitting device package, a display apparatus using the same, and a method of manufacturing the light emitting device package.

2. Description of Related Art

Semiconductor light emitting diodes (LEDs) have been used as light sources in various electronic products, as well as light sources in lighting devices. In particular, semiconductor LEDs are widely used as light sources for various types of display devices, such as televisions, mobile phones, personal computers (PCs), laptop PCs, and personal digital assistants (PDAs).

Conventional display devices have included display panels, commonly, liquid crystal display (LCD) panels and backlight units; recently, however, display devices which do not require additional backlight units, due to the use of an LED device as a single pixel therein, have been under development. Such display devices may be miniaturized, and may be implemented as high luminance displays with improved optical efficiency, as compared to conventional LCDs. Further, such display devices may allow an aspect ratio of a displayed image to be freely changed, and may be implemented as large display devices, thereby facilitating the development of a range of large display devices.

SUMMARY

An aspect of the present inventive concept may provide a light emitting device package not requiring a separate thin film transistor (TFT) substrate, a method of manufacturing the same, and a display apparatus using the light emitting device package.

According to an aspect of the present inventive concept, a light emitting device package may include a cell array including a plurality of semiconductor light emitting units, and having a first surface and a second surface opposite the first surface, each of the plurality of semiconductor light emitting units having a first conductive semiconductor layer, an active layer, and a second conductive semiconductor layer stacked on each other. The light emitting device package may further include a plurality of wavelength conversion units disposed on the first surface of the cell array to correspond to the plurality of semiconductor light emitting units, respectively, each configured to convert a wavelength of light, emitted by a respective one of the plurality of semiconductor light emitting units, into a different wavelength of light. The light emitting device package may further include a partition structure disposed in a space between the plurality of wavelength conversion units so as to separate the plurality of wavelength conversion units from each other, and a plurality of switching units spaced apart from the plurality of wavelength conversion units within the partition structure, and electrically connected to the plurality of semiconductor light emitting units so as to selectively drive the plurality of semiconductor light emitting units.

According to an aspect of the present inventive concept, a light emitting device package may include: a substrate for growth having a first plane and a second plane opposing the first plane, a plurality of semiconductor light emitting units disposed on the first plane of the substrate for growth to be spaced apart from each other, and each having a first conductive semiconductor layer, an active layer, and a second conductive semiconductor layer, a plurality of wavelength conversion units contacting the plurality of semiconductor light emitting units, respectively, and spaced apart from each other to have a portion of the substrate for growth therebetween, each configured to convert a wavelength of light, emitted by a respective one of the plurality of semiconductor light emitting units, into a different wavelength of light, and a plurality of switching units disposed in the substrate for growth on the first plane of the substrate for growth to be spaced apart from the plurality of semiconductor light emitting units, and electrically connected to the plurality of semiconductor light emitting units so as to selectively drive the plurality of semiconductor light emitting units.

According to an aspect of the present inventive concept, a display apparatus may include: a display panel having a circuit board and a plurality of light emitting device packages disposed on the circuit board to form rows and columns, a panel driving unit driving the display panel, and a control unit controlling the panel driving unit, in which each of the plurality of light emitting device packages may include: a cell array including a plurality of semiconductor light emitting units, and having a first plane and a second plane opposing the first plane, each of the plurality of semiconductor light emitting units having a first conductive semiconductor layer, an active layer, and a second conductive semiconductor layer, a plurality of wavelength conversion units disposed on the first plane of the cell array to correspond to the plurality of semiconductor light emitting units, respectively, and configured to convert a wavelength of light, emitted by the plurality of semiconductor light emitting units, into a different wavelength of light, a partition structure disposed in a space between the plurality of wavelength conversion units so as to separate the plurality of wavelength conversion units from each other, and a plurality of switching units spaced apart from the plurality of wavelength conversion units within the partition structure, respectively, and electrically connected to the plurality of semiconductor light emitting units so as to selectively drive the plurality of semiconductor light emitting units.

According to an aspect of the present inventive concept, a method of manufacturing a light emitting device package may include: providing a plurality of light emitting diode (LED) chips spaced apart from each other by stacking a first conductive semiconductor layer, an active layer, and a second conductive semiconductor layer on a substrate for growth, and etching the substrate for growth to be exposed, forming an insulating layer to cover the plurality of LED chips and an exposed region of the substrate for growth, forming a plurality of switching devices by doping, with impurities, portions of the exposed region of the substrate for growth, each of the plurality of switching devices including a source region and a drain region, forming a plurality of through holes, by which the plurality of LED chips are exposed, respectively, by etching portions of a region of the substrate for growth contacting the plurality of LED chips, and forming a plurality of wavelength conversion units by filling the plurality of through holes with wavelength conversion materials.

According to an aspect of the present inventive concept, a light emitting device package includes a cell array, including a plurality of semiconductor light emitting units, each semiconductor light emitting unit having a first surface at a first vertical height and a second surface opposite the first surface at a second vertical height, and each semiconductor light emitting unit including a first conductive semiconductor layer, an active layer, and a second conductive semiconductor layer stacked on each other; a plurality of wavelength conversion units disposed respectively on the plurality of semiconductor light emitting units, each wavelength conversion unit having a first surface at the first vertical height and a second surface at a third vertical height, wherein the first vertical height is between the second vertical height and the third vertical height, each wavelength conversion unit configured to convert a wavelength of light, emitted by a respective one of the plurality of semiconductor light emitting units, into a different wavelength of light; a partition structure disposed in a space between the plurality of wavelength conversion units so as to separate the plurality of wavelength conversion units from each other, the partition structure extending between the first vertical height and the third vertical height; and a plurality of switching units spaced apart from the plurality of wavelength conversion units within the partition structure, and electrically connected to the plurality of semiconductor light emitting units so as to selectively drive the plurality of semiconductor light emitting units, each switching unit disposed between the first vertical height and the third vertical height.

BRIEF DESCRIPTION OF DRAWINGS

The above and other aspects, features, and advantages of the present disclosure will be more clearly understood from the following detailed description taken in conjunction with the accompanying drawings, in which:

FIGS. 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, and 25B are example schematic cross-sectional views of a process of manufacturing a light emitting device package;

DETAILED DESCRIPTION

Figure 1:
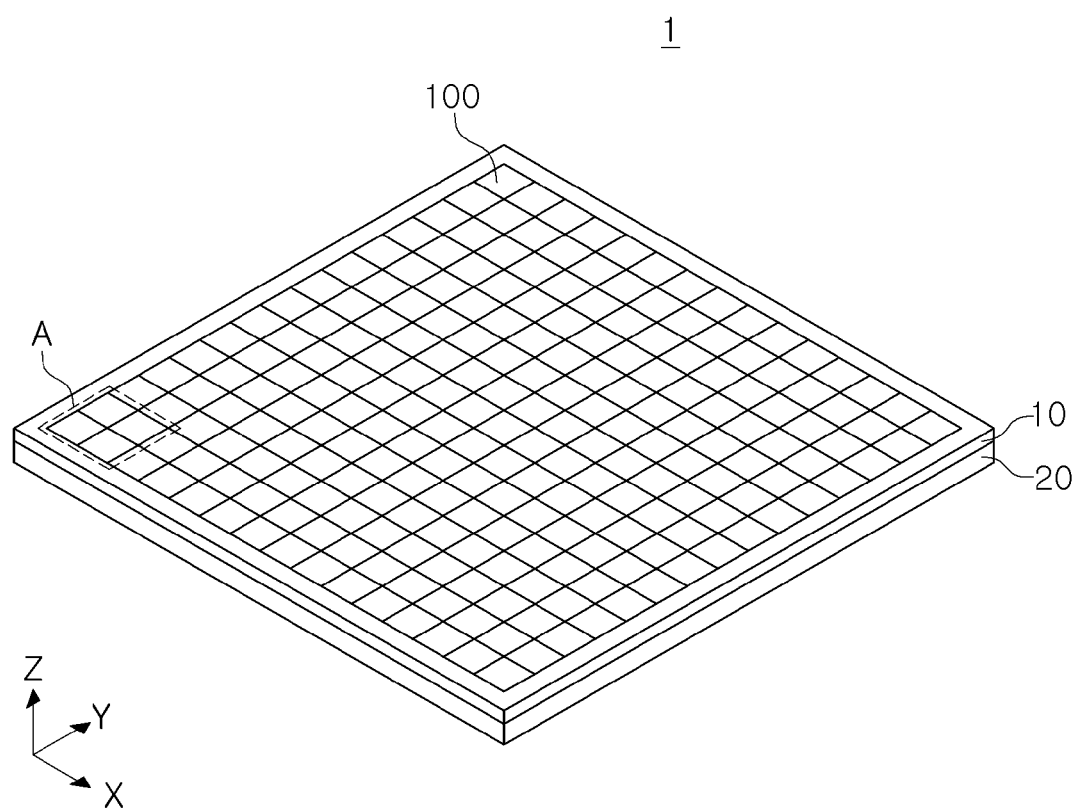
FIG. 1 is a schematic perspective view of a display panel including alight emitting device package according to an example embodiment of the present inventive concept.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

FIG. 1 is a schematic perspective view of a display panel including a light emitting device package according to an example embodiment of the present inventive concept.

Referring to FIG. 1, a display panel 1 may include a circuit board 20 and a light emitting device module 10 disposed on the circuit board 20.

According to an example embodiment, the light emitting device module 10 may include a plurality of light emitting device packages 100 that may selectively emit red, green, or blue (RGB) light. Each of the plurality of light emitting device packages 100 may form a single pixel of the display panel 1, and may be disposed on the circuit board 20 to form rows and columns. In an example embodiment, the light emitting device packages 100 may be exemplified as being arranged in a 15×15 matrix, but this is only for ease of description. For example, a larger number of light emitting device packages may be provided, depending on a required resolution (for example, a resolution of 1,024×768).

Each of the light emitting device packages 100 may include sub-pixels corresponding to RGB light sources, and the sub-pixels may have a structure in which they are spaced apart from each other. This will be described in more detail with reference to FIGS. 3 through 6. A color of each of the sub-pixels is not limited to RGB, and a cyan, yellow, magenta, or black (CYMK) light source may also be used.

The circuit board 20 may include a circuit configured to supply power to each of the light emitting device packages 100 of the light emitting device module 10, and a circuit configured to drive the light emitting device packages 100. For example, the circuit board 20 may include a power supply circuit (PSC) and a driving circuit (DC).

If necessary, the display panel 1 may further include a black matrix disposed on the circuit board 20. For example, the black matrix may be disposed around the circuit board 20 to function as a guide line defining a mounting region of the light emitting device packages 100. The black matrix is not limited to black. A white or green matrix may be used rather than the black matrix, depending on the purposes or uses of products, and a matrix formed of a transparent material may also be used, if necessary. The white matrix may further include a reflective material or a light scattering material. The black matrix may include at least one among materials, such as a polymer containing a resin, a ceramic, a semiconductor, or a metal.

Figure 2:
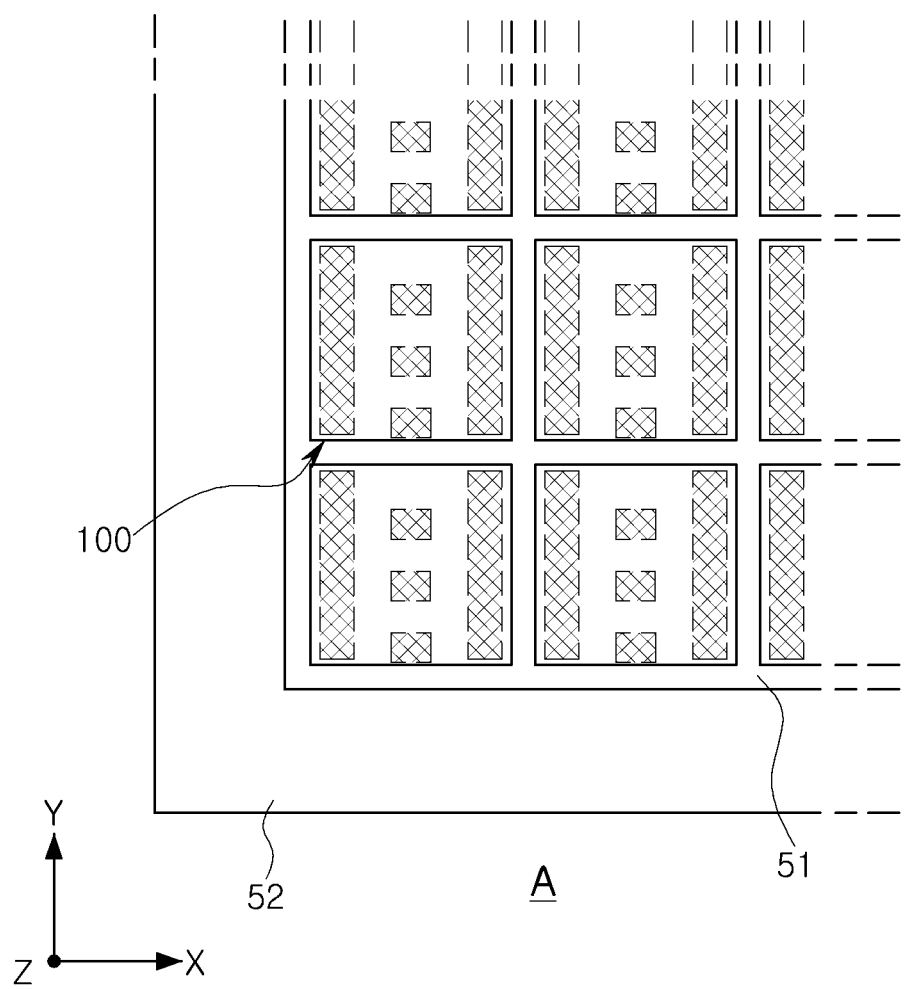
FIG. 2 is an example enlarged plan view of region A of FIG. 1.
Figure 3:
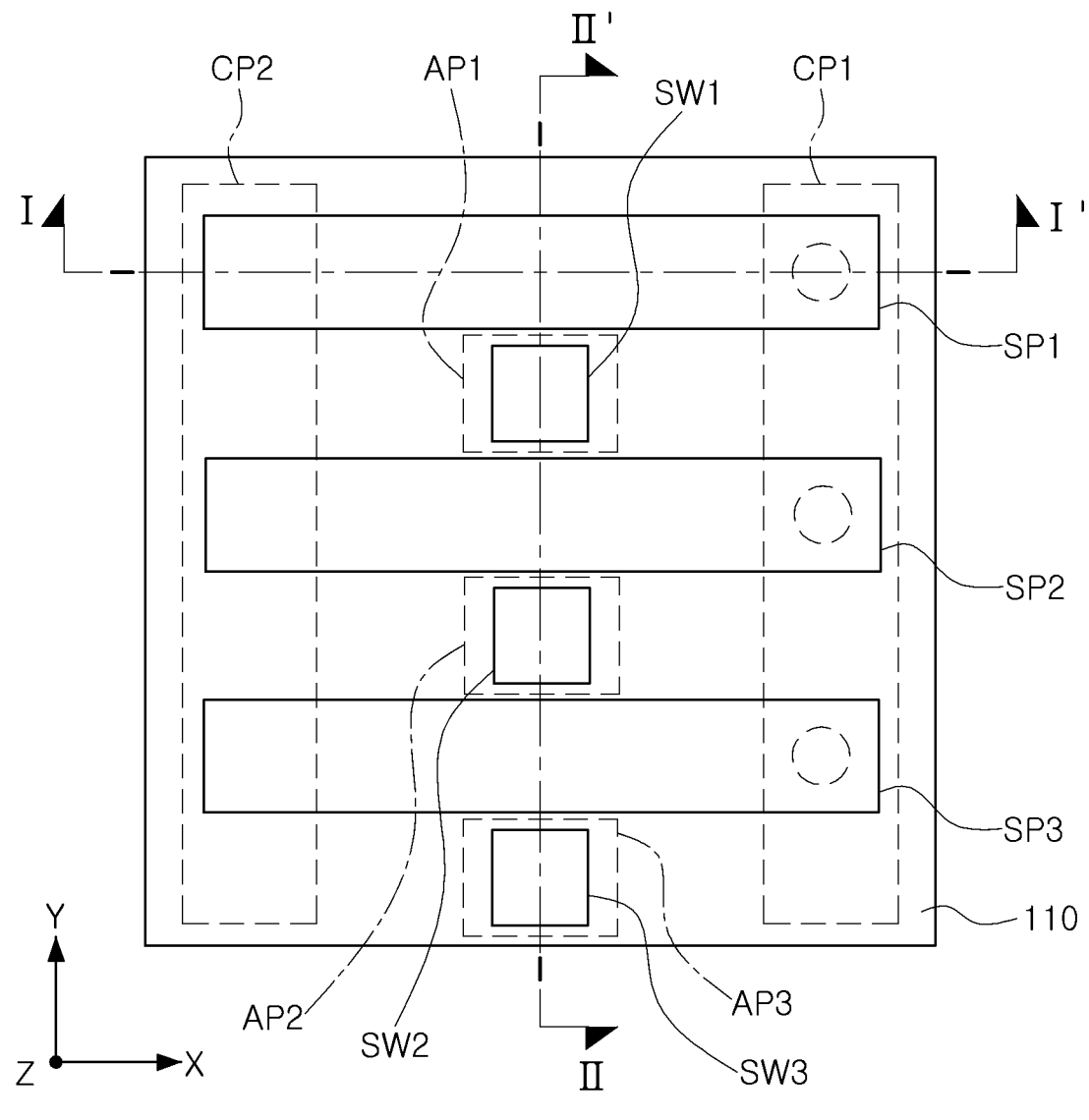
FIG. 3 is an example enlarged plan view of a portion of FIG. 2.
Figure 4:
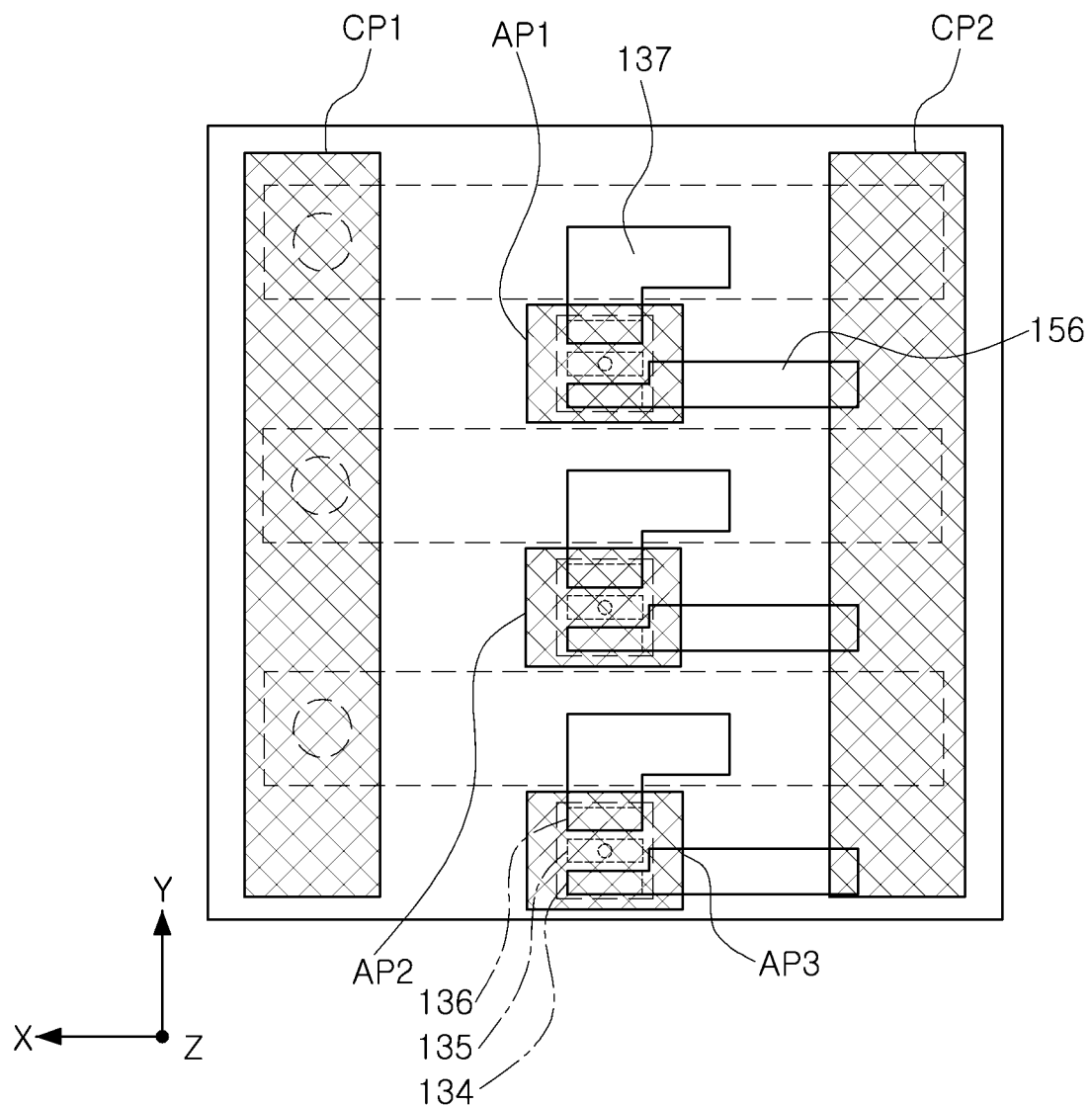
FIG. 4 is an example enlarged rear view of the portion of FIG. 2.

FIG. 2 is an enlarged plan view of the display panel 1, illustrated in FIG. 1, and in particular, of region A of the light emitting device module 10. FIG. 3 is an enlarged plan view of a portion of FIG. 2. FIG. 4 is an enlarged rear view of the portion of FIG. 2.

Referring to FIG. 2, the plurality of light emitting device packages 100 may be surrounded by a molding unit 51. The molding unit 51 may also include a black matrix, and regions of the light emitting device packages 100 surrounded by the molding unit 51 may be provided as light emitting regions in which the light emitting device packages 100 may be disposed, respectively, while an external region 52 of the molding unit 51 may be provided as a non-light emitting region. The molding unit 51 may electrically separate the light emitting device packages 100 from each other, and each of the light emitting device packages 100 may thus be independently driven as a single pixel.

Referring to FIG. 3, each of the light emitting device packages 100 forming a single pixel may include a first sub-pixel SP1, a second sub-pixel SP2, and a third sub-pixel SP3, and the first to third sub-pixels SP1 to SP3 may be surrounded by a partition structure 110. The partition structure 110 may have three switching units SW1, SW2, and SW3 for controlling the first to third sub-pixels SP1 to SP3. In an example embodiment, a single light emitting device package 100 may be exemplified as having three sub-pixels and three switching units, but this is only for ease of description, and the single light emitting device package 100 may have two sub-pixels and two switching units disposed therein. Further, respective switching units may be exemplified as being spaced apart from each other, but a plurality of switching units may also be disposed to have the appearance of a single switching unit by the switching units being in contact with each other.

Referring to FIG. 4, each of the light emitting device packages 100 may have two common electrode pads CP1 and CP2 and three separate electrode pads AP1, AP2, and AP3, provided on a lower surface thereof. In an example embodiment, the two common electrode pads CP1 and CP2 and a row of the three separate electrode pads AP1, AP2, and AP3 may be exemplified as being arranged parallel to each other in a single direction, but the present inventive concept is not limited thereto.

Figure 5:
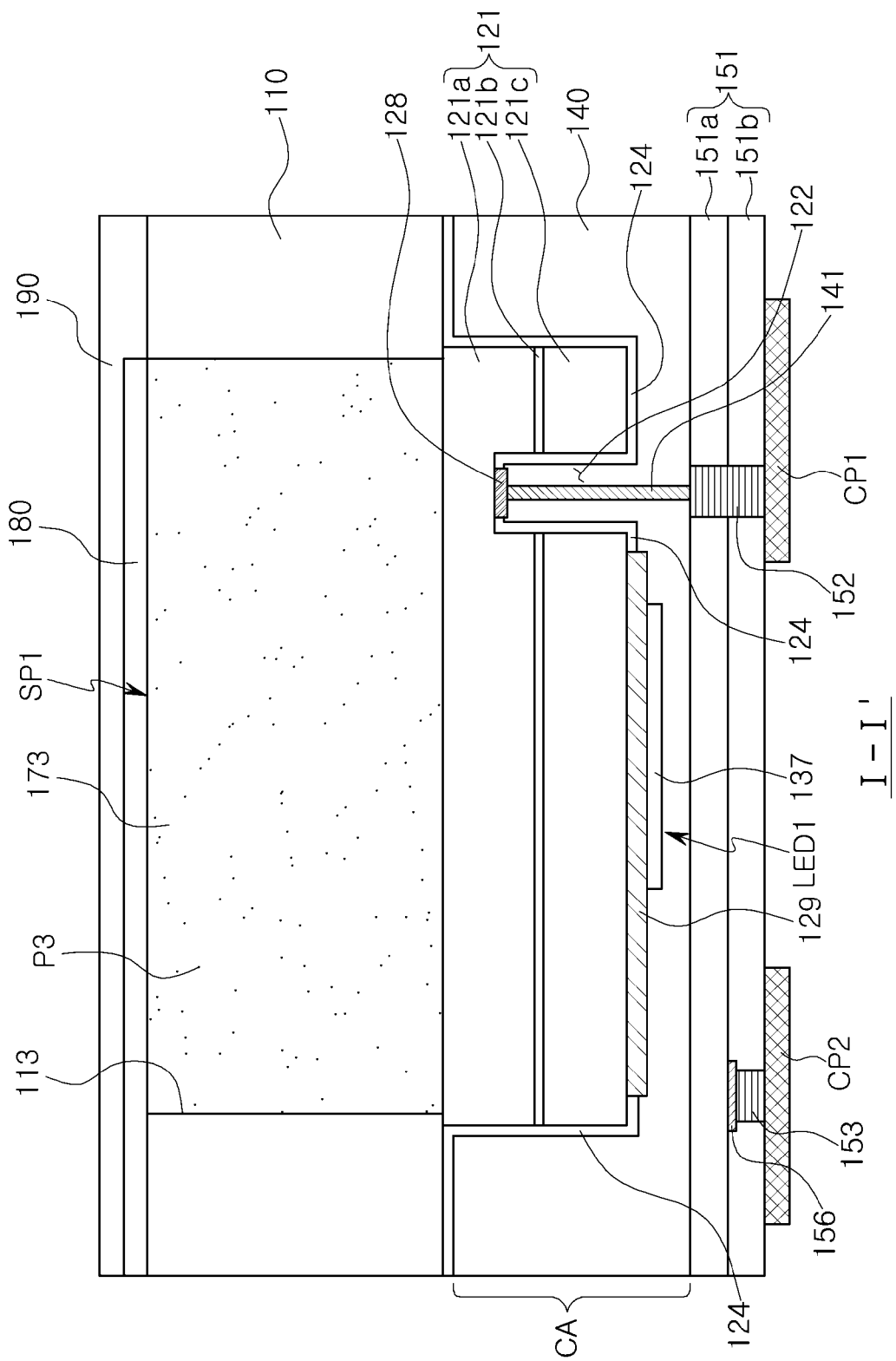
FIG. 5 is an example cross-sectional view taken along line I-I' of FIG. 3.
Figure 6:
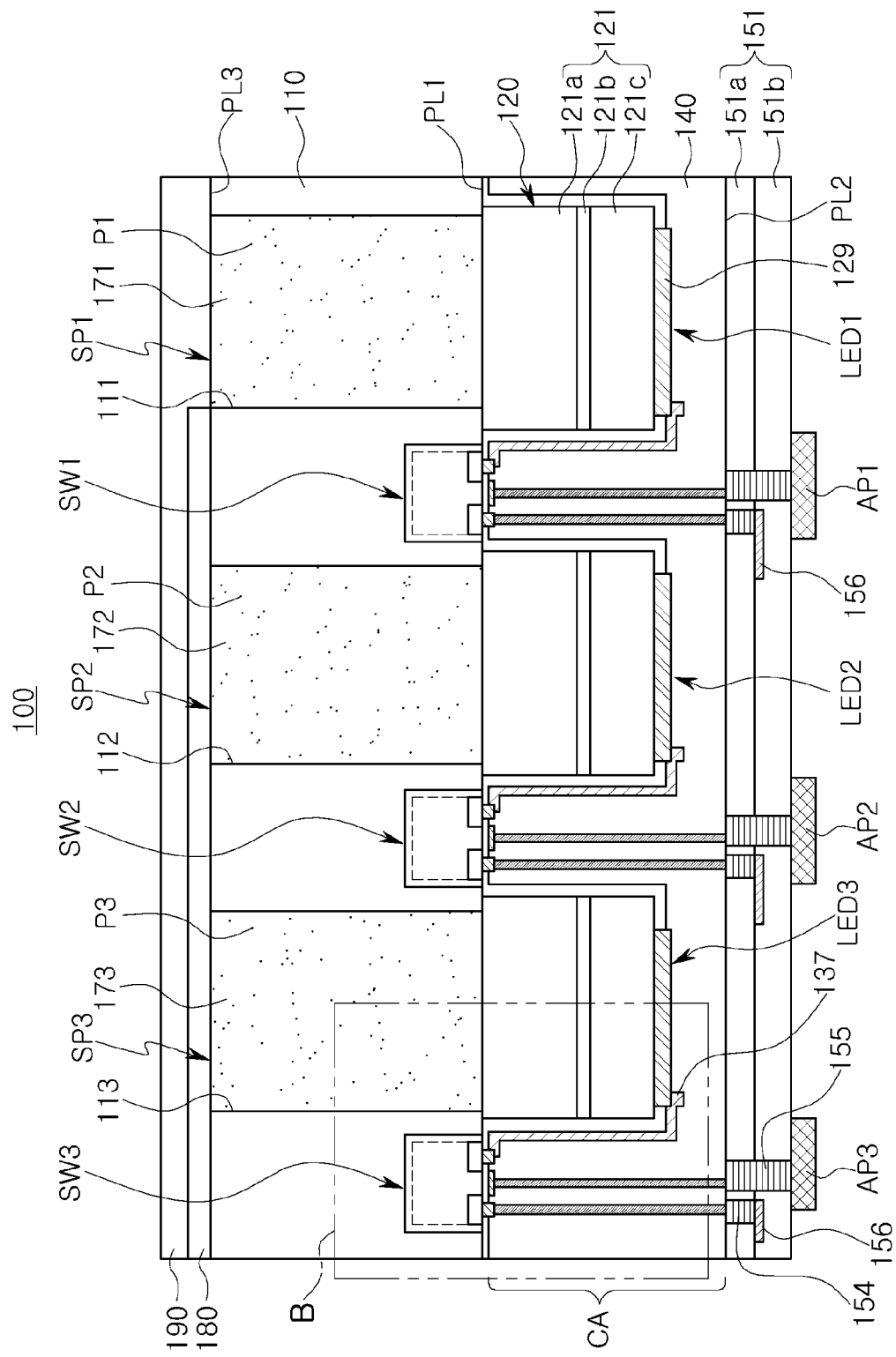
FIG. 6 is an example cross-sectional view taken along line II-II' of FIG. 3.
Figure 7:
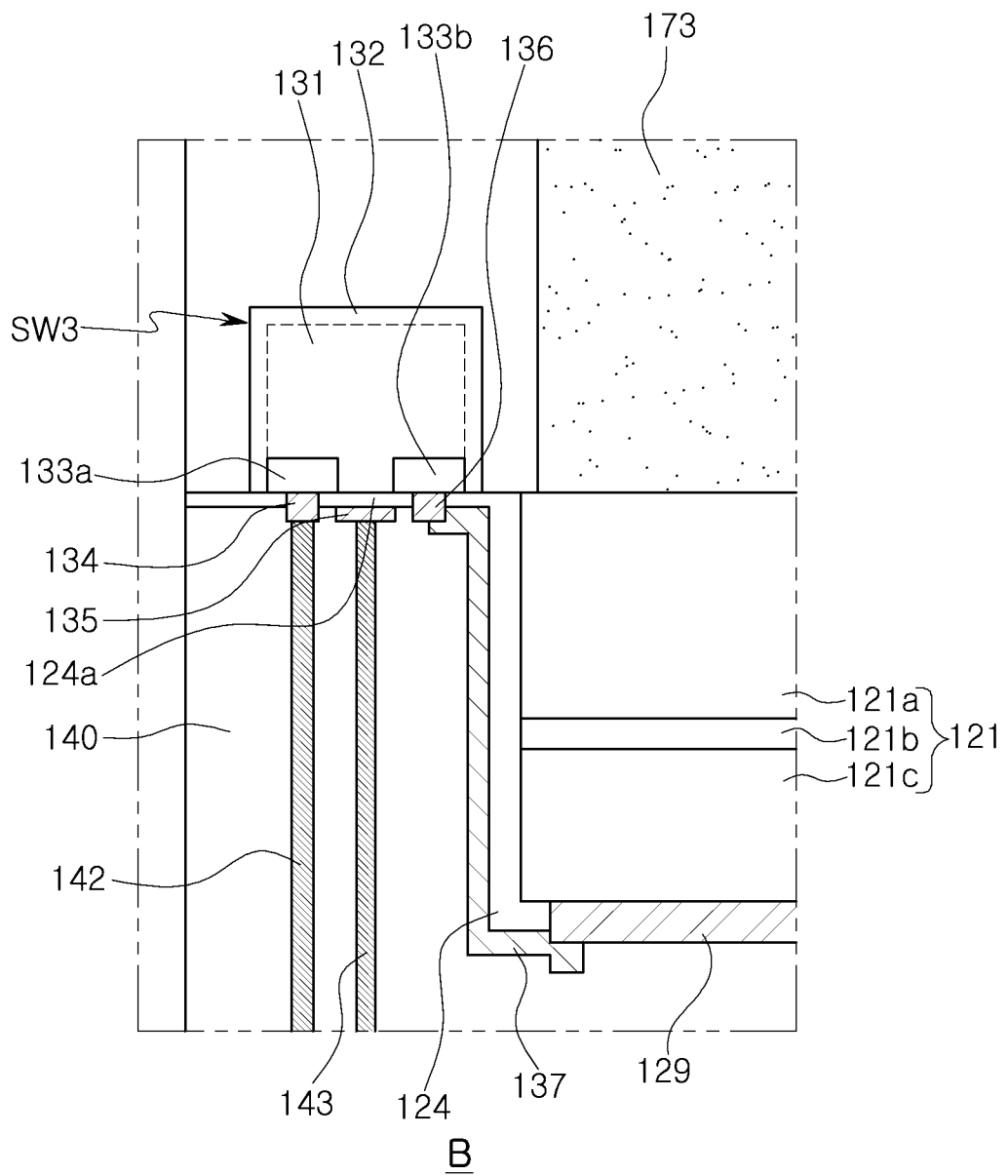
FIG. 7 is an example enlarged cross-sectional view of region B of FIG. 6.

FIG. 5 is a cross-sectional view taken along line I-I' of FIG. 3. FIG. 6 is a cross-sectional view taken along line II-II' of FIG. 3. FIG. 7 is an enlarged cross-sectional view of region B of FIG. 6.

Referring to FIGS. 5 through 7, the light emitting device package 100 according to an example embodiment may include a cell array CA, including a first semiconductor light emitting unit LED1, a second semiconductor light emitting unit LED2, and a third semiconductor light emitting unit LED3, a first wavelength conversion unit 171, a second wavelength conversion unit 172, and a third wavelength conversion unit 173, disposed on the cell array CA, the partition structure 110 having the first to third wavelength conversion units 171 to 173 spaced apart from each other, and the first to third switching units SW1 to SW3 disposed in the partition structure 110.

The cell array CA may include the first to third semiconductor light emitting units LED1 to LED3, and may have a first plane PL1 (e.g., at a first vertical height) and a second plane PL2 (e.g., at a second vertical height) opposing each other (e.g., first and second surfaces facing opposite directions). The first plane PL1 may have the first to third semiconductor light emitting units LED1 to LED3 disposed thereon to be adjacent to each other, and the first to third wavelength conversion units 171 to 173 may thus contact the first to third semiconductor light emitting units LED1 to LED3, respectively. Each individual one of the first to third semiconductor light emitting units LED1 to LED3 may also be referred to as semiconductor light emitting source.

The first to third semiconductor light emitting units LED1 to LED3 may emit light having the same or different colors. For example, the first to third semiconductor light emitting units LED1 to LED3 may all emit the same blue light (for example, light having a wavelength of 440 nm to 460 nm) or the same ultraviolet light (for example, light having a wavelength of 380 nm to 440 nm), and may also emit RGB light, respectively. An example embodiment describes a case in which the first to third semiconductor light emitting units LED1 to LED3 emit blue light as an example.

Each of the first to third semiconductor light emitting units LED1 to LED3 may have a light emitting structure 121 that may include a first conductive semiconductor layer 121a, a second conductive semiconductor layer 121c, and an active layer 121b disposed in a space therebetween.

The first conductive semiconductor layer 121a and the second conductive semiconductor layer 121c may be a p-type semiconductor layer and an n-type semiconductor layer, respectively. For example, each of the first and second conductive semiconductor layers 121a and 121c may be a nitride semiconductor having a composition of $Al_xIn_yGa_{(1-x-y)}N$ ($0 \leq x \leq 1$, $0 \leq y \leq 1$, $0 \leq x+y \leq 1$), but the present inventive concept is not limited thereto, and a GaAs- or GaP-based semiconductor may also be used. The active layer 121b may have a multiple quantum well (MQW) structure in which quantum well layers and quantum barrier layers are alternately stacked with each other. For example, the active layer 121b may have a nitride-based MQW, such as InGaN/GaN or GaN/AlGaN, but the present inventive concept is not limited thereto, and the active layer 121b may be another semiconductor, such as GaAs/AlGaAs, InGaP/GaP, or GaP/AlGaP.

The active layer 121b of each of the first to third semiconductor light emitting units LED1 to LED3 may be configured to emit light having different wavelengths. This emitted light may be realized in various ways. In an example embodiment, the active layer 121b of each of the first to third semiconductor light emitting units LED1 to LED3 may be configured to emit light having different colors, and may also be configured to emit light having the same color. For example, the active layers 121b may emit red, green and blue light, respectively, or may emit the same blue light or the same ultraviolet light.

The first and second conductive semiconductor layers 121a and 121c may be electrically connected to first and second electrodes 128 and 129, respectively. The first and second electrodes 128 and 129 may be disposed in a mesa-etched region 122 of the first conductive semiconductor layer 121a and on the second conductive semiconductor layer 121c, respectively. For example, the first electrode 128 may include at least one of aluminum (Al), gold (Au), chromium (Cr), nickel (Ni), titanium (Ti), or tin (Sn), and the second electrode 129 may be formed of a reflective metal. For example, the second electrode 129 may include a material, such as silver (Ag), nickel (Ni), aluminum (Al), chromium (Cr), rhodium (Rh), palladium (Pd), iridium (Ir), ruthenium (Ru), magnesium (Mg), zinc (Zn), platinum (Pt), or gold (Au), and may be employed as a structure having a single layer or two or more layers.

An insulating layer 124 may be disposed on surfaces of the first to third semiconductor light emitting units LED1 to LED3 and on the first plane PL1 of the cell array CA to define regions in which the first and second electrodes 128 and 129 of each of the first to third semiconductor light emitting units LED1 to LED3 may be disposed. Further, the insulating layer 124 disposed on the first plane PL1 of the cell array CA may define regions in which a source electrode 136 and a drain electrode 134 of each of the first to third switching units SW1 to SW3 may be disposed. As illustrated in FIG. 7, an insulating layer 124a, disposed in a space between the source electrode 136 and the drain electrode 134, may be used as a gate insulating layer of each of the first to third switching units SW1 to SW3.

As illustrated in FIG. 6, the cell array CA may include a molding unit 140 that may form the second plane PL2 of the cell array CA while packaging the first to third semiconductor light emitting units LED1 to LED3. The molding unit 140 may be configured to expose a first conductive via 141, a second conductive via 142, and a third conductive via 143, connected to the first to third semiconductor light emitting units LED1 to LED3 and the first to third switching units SW1 to SW3, respectively, to the second plane PL2. The molding unit 140 may have a high level of Young's Modulus to stably support the first to third semiconductor light emitting units LED1 to LED3. Further, the molding unit 140 may include a material having a high level of thermal conductivity to effectively dissipate heat generated by the first to third semiconductor light emitting units LED1 to LED3. For example, the molding unit 140 may include a material containing an epoxy resin or a silicone resin, and may also include light-reflective particles for reflecting light. The light-reflective particles may include a titanium dioxide (TiO2) and/or an aluminum oxide (Al3O3), but the present inventive concept is not limited thereto.

The cell array CA may have a multilayer circuit board 151 disposed on the second plane PL2 thereof to connect the first to third conductive vias 141 to 143 to the common electrode pads CP1 and CP2 and to the separate electrode pads AP1, AP2, and AP3. The multilayer circuit board 151 may include a plurality of printed circuit boards (PCBs) 151a and 151b that may be stacked, and the PCBs 151a and 151b may include a through electrode 154 and a wiring 156. The multilayer circuit board 151 may have the common electrode pads CP1 and CP2 and the separate electrode pads AP1, AP2, and AP3 disposed on a surface thereof.

The cell array CA may have the partition structure 110 disposed on the first plane PL1 thereof, the first to third wavelength conversion units 171 to 173 may be separated from each other in the partition structure 110, and the partition structure 110 may have the first to third switching units SW1 to SW3 disposed therein. The partition structure as well as the first to third wavelength conversion units 171 to 173 may extend between the first plane PL1 and a third plane PL3 at a third vertical height. As such, the partition structure and the first to third wavelength conversion units 171 to 173 may have a first surface at the first vertical height (e.g., the first plane PL1) and a second surface at the third vertical height (e.g., the third plane PL3).

The partition structure 110 may contact the first plane PL1 of the cell array CA, and may have a first light emitting window 111, a second light emitting window 112, and a third light emitting window 113 disposed in positions corresponding to those of the first to third semiconductor light emitting units LED1 to LED3. The first to third light emitting windows 111 to 113 may be provided as spaces for forming the first to third wavelength conversion units 171 to 173, respectively. The partition structure 110 may include a light blocking material such that different wavelengths of light penetrating through the first to third wavelength conversion units 171 to 173 may not interfere with each other. Further, the partition structure 110 may be formed of a substrate for growth for growing the first to third semiconductor light emitting units LED1 to LED3. The partition structure 110 may be a semiconductor substrate in which the first to third switching units SW1 to SW3 may be formed by injecting impurities. For example, the partition structure 110 may be a group IV semiconductor substrate or a group III-IV compound semiconductor substrate, such as a silicon (Si) substrate, an SiC substrate, or an SiGe substrate.

The partition structure 110 may separate the first to third wavelength conversion units 171 to 173 from each other, and may surround lateral surfaces of the first to third wavelength conversion units 171 to 173. The partition structure 110 may contact the molding unit 140. As such, the partition structure 110 and the molding unit 140 may extend from a space between the first to third wavelength conversion units 171 to 173 to a space between the first to third semiconductor light emitting units LED1 to LED3 to thus effectively block the interference between light emitted by the first to third semiconductor light emitting units LED1 to LED3.

The first to third wavelength conversion units 171 to 173 may adjust wavelengths of light, emitted by the first to third semiconductor light emitting units LED1 to LED3, into wavelengths of light corresponding to different colors. In an example embodiment, the first to third wavelength conversion units 171 to 173 may be configured to provide blue, green, and red light, respectively. The wavelength conversion units described herein are also referred to as wavelength conversion pillars (e.g., first, second, third, etc., pillars), or wavelength conversion layers (e.g., first, second, third, etc., layers).

As illustrated in an example embodiment, when the first to third semiconductor light emitting units LED1 to LED3 emit blue light, the second and third wavelength conversion units 172 and 173 may include green and red phosphors P2 and P3, respectively. The second and third wavelength conversion units 172 and 173 may be formed by dispensing, in the second and third light emitting windows 112 and 113, light-transmitting liquid resins in which a wavelength conversion material, such as the green or red phosphor P2 or P3, may not be mixed, but may be formed using various different processes. For example, the second and third wavelength conversion units 172 and 173 may be provided as wavelength conversion films.

If necessary, the second and third wavelength conversion units 172 and 173 may further include a light filtering layer 180 that may selectively block blue light. Use of the light filtering layer 180 may allow the second and third light emitting windows 112 and 113 to emit only desired green and red light, respectively.

As illustrated in an example embodiment, when the first to third semiconductor light emitting units LED1 to LED3 emit blue light, the first wavelength conversion unit 171 may not include a phosphor. Thus, the first wavelength conversion unit 171 may provide the same blue light as that emitted by the first semiconductor light emitting unit LED1.

The first wavelength conversion unit 171 may be formed by dispensing a light-transmitting liquid resin in which a phosphor is not mixed, but according to an example embodiment, may include a blue or blue-green phosphor (for example, wavelength: 480 nm to 520 nm) for adjusting color coordinates of blue light. Such a phosphor may be employed to adjust the color coordinates of blue light that may be provided by the first wavelength conversion unit 171, and may be mixed in an amount less than that of a phosphor mixed in the second and third wavelength conversion units 172 and 173.

As illustrated in FIGS. 5 and 6, the first to third wavelength conversion units 171 to 173 may have an encapsulation unit 190 disposed on surfaces thereon to prevent degradation of a phosphor.

The partition structure 110 may have the first to third switching units SW1 to SW3 disposed therein to control the first to third semiconductor light emitting units LED1 to LED3 to be selectively driven.

Referring to FIGS. 3 and 6, the first to third switching units SW1 to SW3 may be disposed in regions adjacent to those of the first to third semiconductor light emitting units LED1 to LED3, respectively. The first to third semiconductor light emitting units LED1 to LED3 may be disposed in a row that is parallel with respect to the first plane PL1. The first to third switching units SW1 to SW3 may be disposed in certain positions within the partition structure 110 in various ways.

Figure 8:
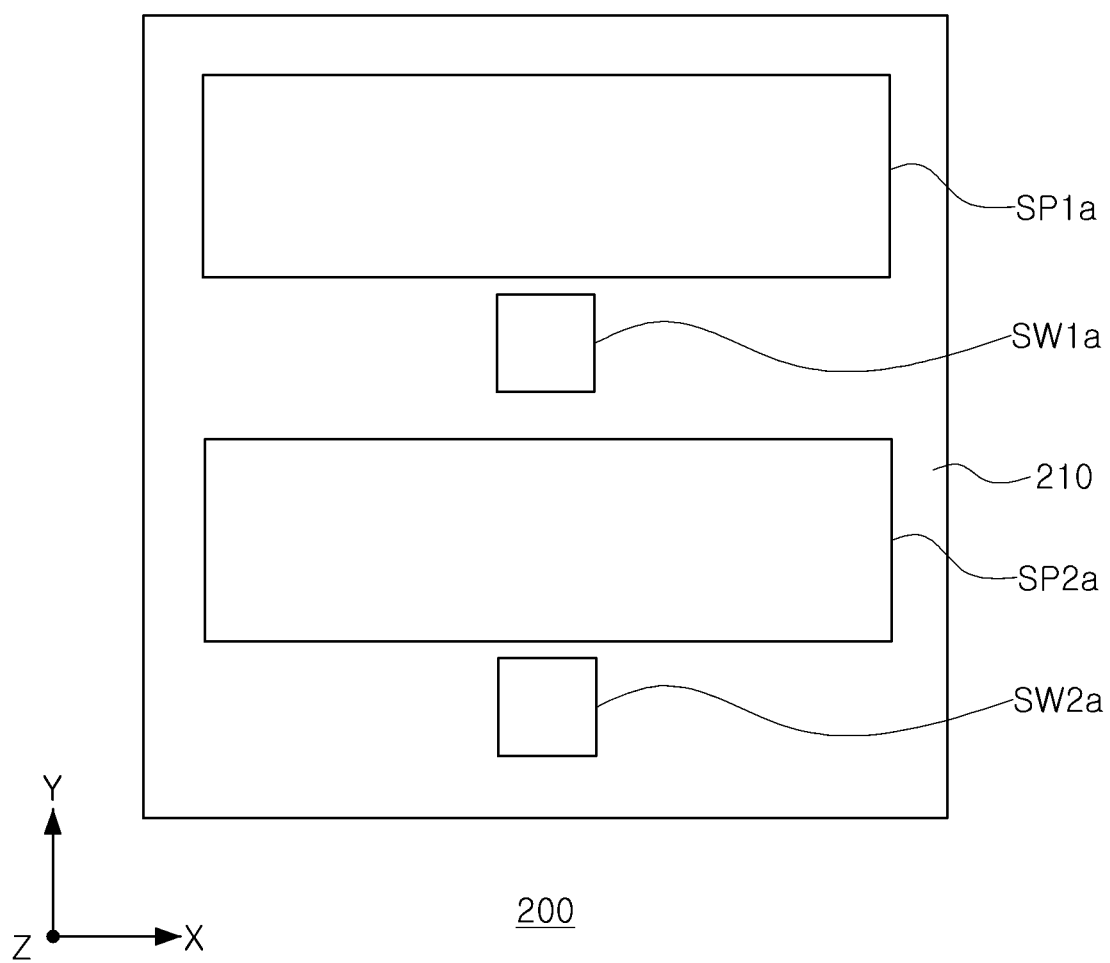
FIGS. 8 through 10 are plan views of light emitting device packages having various structures employable according to an example embodiment of the present inventive concept.
Figure 9:
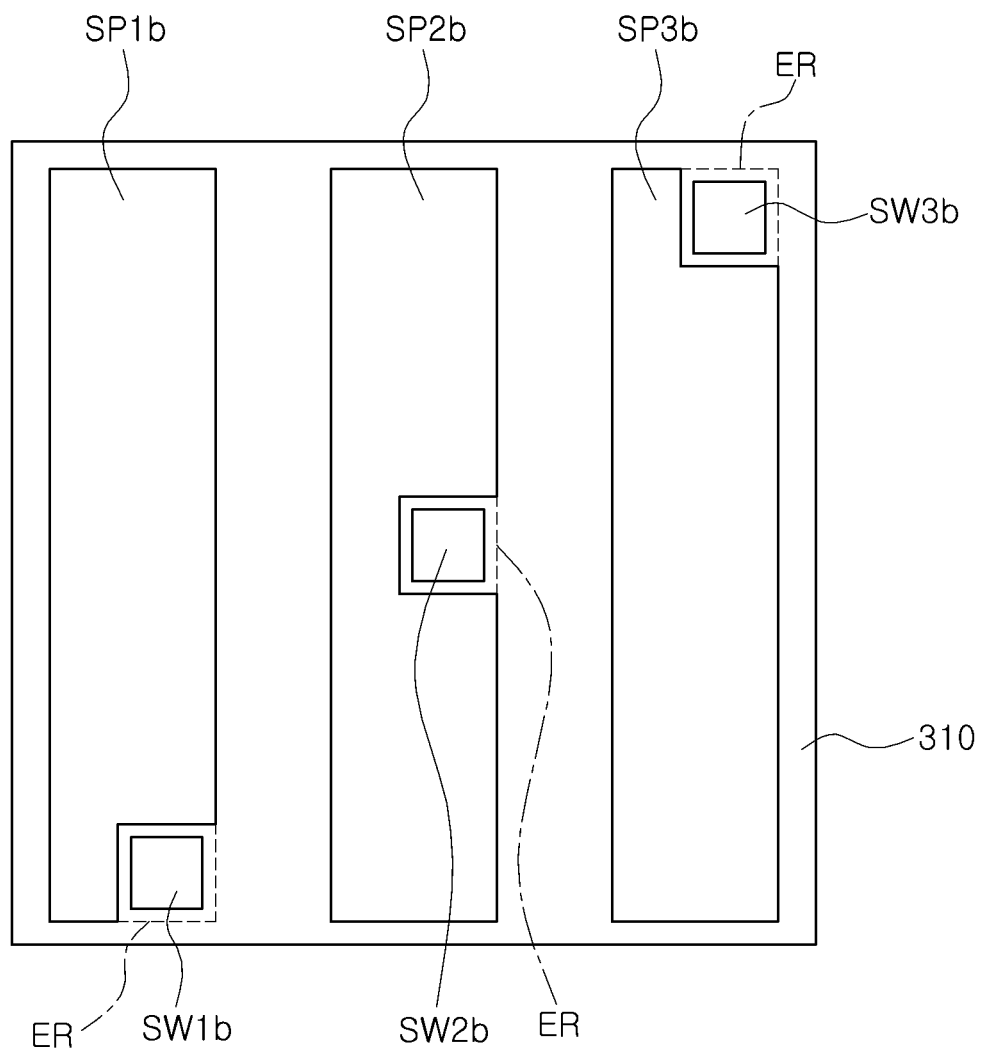
Figure 10:
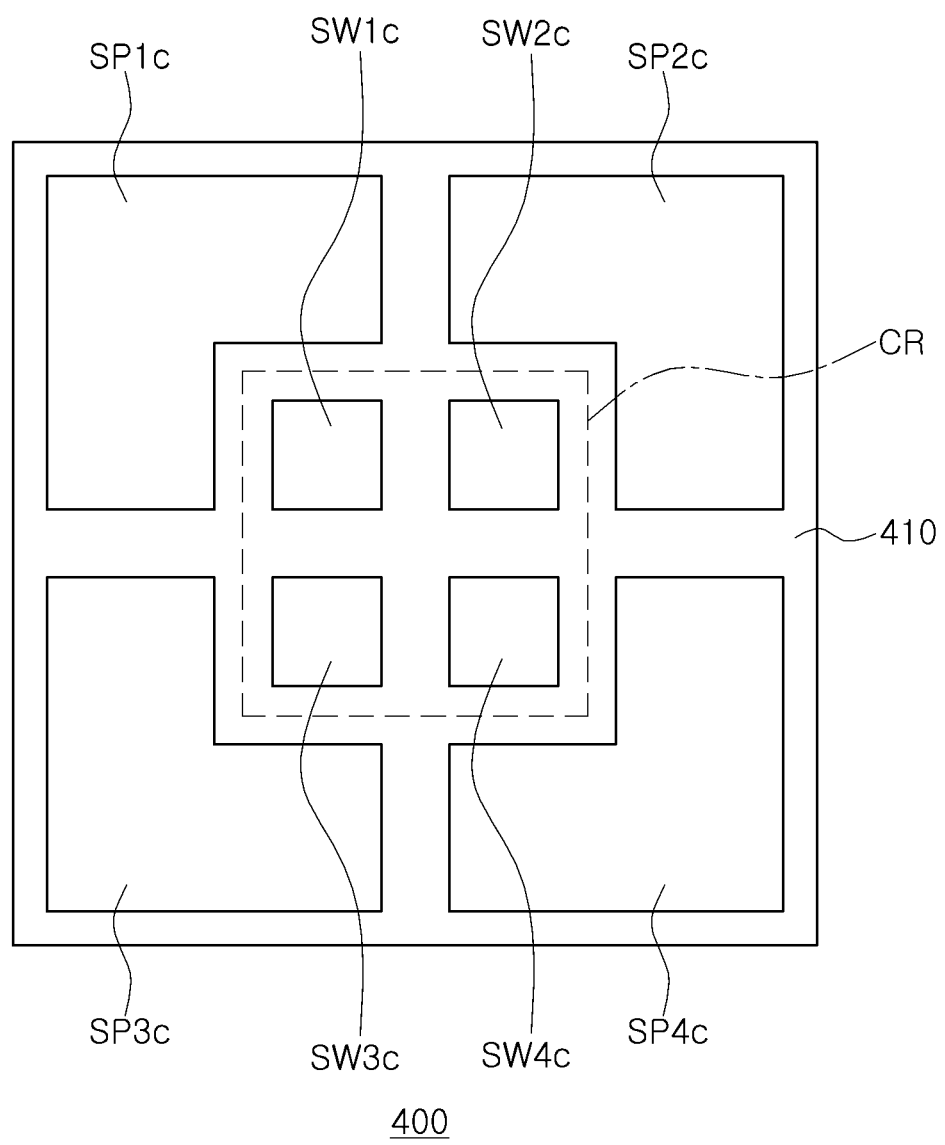

FIGS. 8 through 10 are plan views of light emitting device packages having various structures employable according to an example embodiment of the present inventive concept, and example embodiments in which positions of the first to third switching units SW1 to SW3 according to an example embodiment described above are changed.

A light emitting device package 200 of FIG. 8 may differ from the light emitting device packages 100 of FIG. 3, in that a partition structure 210 may have two sub-pixels and two switching units disposed therein, as compared to the light emitting device package 100 of FIG. 3. Other configurations may be the same as that described in FIG. 3. When the light emitting device package 200 is disposed in such a configuration, the light emitting device package 200 may be beneficial to have a first sub-pixel SP1*a* and a second sub-pixel SP2*a* disposed therein in order to allow for larger light emitting device packages to be formed.

A light emitting device package 300 of FIG. 9 may differ from the light emitting device packages 100 of FIG. 3, in that each of a first switching unit SW1*b*, a second switching unit SW2*b*, and a third switching unit SW3*b* may have a region ER of a partition structure 310 protruding internally from each of a first sub-pixel SP1*b*, a second sub-pixel SP2*b*, and a third sub-pixel SP3*b*, as compared to the first to third switching units SW1 to SW3 of FIG. 3. Other configurations may be the same as that described in FIG. 3. When the light emitting device package 300 is disposed in such a configuration, a thickness between the first to third sub-pixels SP1*b* to SP3*b* may be further reduced, and sizes of the first to third sub-pixels SP1*b* to SP3*b* may be further increased.

A light emitting device package 400 of FIG. 10 may differ from the light emitting device package 300 of FIG. 3, in that four sub-pixels and four switching units may be disposed, a first switching unit SW1*c*, a second switching unit SW2*c*, a third switching unit SW3*c*, and a fourth switching unit SW4*c* may be disposed in a central region CR of a partition structure 410, or a first sub-pixel SP1*c*, a second sub-pixel SP2*c*, a third sub-pixel SP3*c*, and a fourth sub-pixel SP4*c* may be disposed around the central region CR. Other configurations may be the same as that described in FIG. 3. When the number of sub-pixels is increased, the light emitting device package 400 may be beneficial in increasing a band of light emitted by disposing a sub-pixel for emitting light (for example, white light) other than RGB light.

The first to third switching units SW1 to SW3 may be electrically connected to the first to third semiconductor light emitting units LED1 to LED3, respectively, to control the first to third semiconductor light emitting units LED1 to LED3. Each of the first to third switching units SW1 to SW3 may be a switching device, for example, a metal oxide silicon field effect transistor (MOSFET). In an example embodiment, each of the first to third switching units SW1 to SW3 may be an N-channel MOSFET.

The first to third switching units SW1 to SW3 may have the same structure. Referring to FIGS. 6 and 7, to prevent repetition of the same description here, only the third switching unit SW3 is described, but the first and second switching units SW1 and SW2 may have the same structure as SW3.

The third switching unit SW3 may have a p-well region 131, formed by injecting a p-type impurity into the inside of an n-well that may be formed by injecting an n-type impurity, while a source region 133b and a drain region 133a, formed by injecting an n-type impurity, may also be disposed in a region of the p-well region 131. When power is applied to the third switching unit SW3, a gate insulating layer 124a may be disposed in a space between the drain region 133a and the source region 133b, in which an n-type channel may be formed. The source electrode 136 and the drain electrode 134 may be connected to the source region 133b and the drain region 133a, respectively, and a gate electrode 135 may be disposed on the gate insulating layer 124a. The third switching unit SW3 may be spaced apart from a wavelength conversion unit adjacent thereto in order not to contact the wavelength conversion unit, and may be smaller than the partition structure 110.

A connecting electrode 137 may be disposed in a space between the source electrode 136 and the second electrode 129 of the third semiconductor light emitting unit LED3, to electrically connect the third switching unit SW3 to the third semiconductor light emitting unit LED3.

Figure 11:
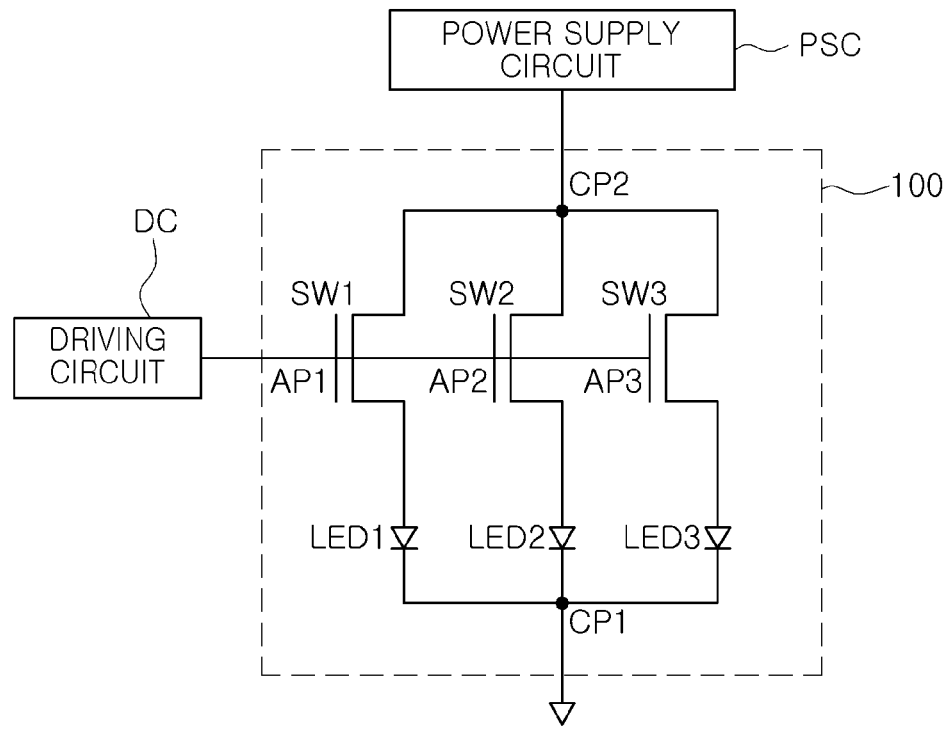
FIG. 11 is an example circuit diagram of a light emitting device package.

Referring to FIGS. 7 and 11, a circuit configuration of the first to third switching units SW1 to SW3 and the first to third semiconductor light emitting units LED1 to LED3 will be described. FIG. 11 is a circuit diagram of the light emitting device package 100. The drain electrode 134 of each of the first to third switching units SW1 to SW3 may be connected to the common electrode pad CP2 to receive power from a PSC, and the source electrode 136 of each of the first to third switching units SW1 to SW3 may be connected to each of the first to third switching units SW1 to SW3. Further, the gate electrode 135 of each of the first to third switching units SW1 to SW3 may be connected to each of the separate electrode pads AP1, AP2, and AP3. Thus, a control signal of the driving circuit DC, which is connected to the separate electrode pads AP1, AP2, and AP3, may allow the gate electrode 135 of each of the first to third switching units SW1 to SW3 to be turned on/off, and, accordingly, power applied to the first to third semiconductor light emitting units LED1 to LED3 may be controlled.

Figure 12:
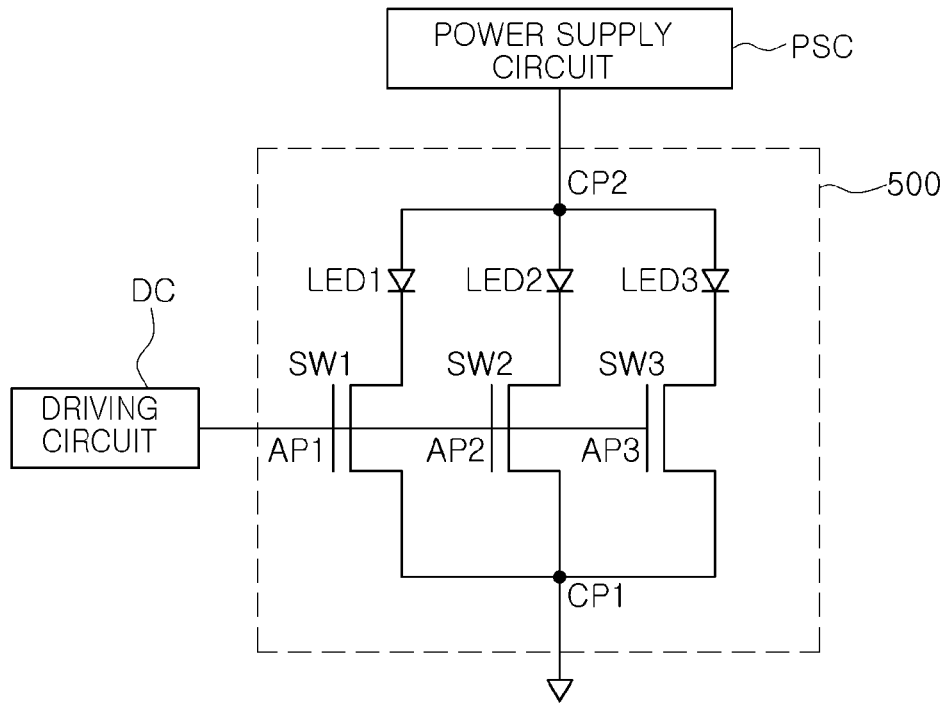
FIG. 12 is an example circuit diagram of a light emitting device package having another structure employable according to an example embodiment of the present inventive concept.

FIG. 12 is a circuit diagram of the light emitting device package 500 having another structure employable according to an example embodiment of the present inventive concept, and as compared to the above-mentioned circuit configuration, a circuit configuration of the light emitting device package 500 may differ from the above-mentioned circuit configuration, in that first to third semiconductor light emitting units LED1 to LED3 may be connected to drain electrodes of first to third switching units SW1 to SW3, respectively.

The light emitting device package 100 having such a configuration as in FIG. 11 or 12 may have a switching unit formed within a partition structure, including a wavelength conversion unit to control a semiconductor light emitting unit, thus controlling the semiconductor light emitting unit for outputting an image signal to be turned on/off without a separate thin film transistor (TFT) substrate. Thus, as compared to a case in which a separate TFT substrate is required, manufacturing costs may be reduced, and an ultra thin display panel having a further reduced thickness may be provided.

According to an example embodiment, there may be provided a display apparatus, including a display panel having a circuit board and a plurality of light emitting device packages disposed on the circuit board to form rows and columns; a panel driving unit driving the display panel; and a control unit controlling the panel driving unit. Each of the light emitting device packages may include a cell array including first to third semiconductor light emitting units, each having a first conductive semiconductor layer, an active layer, and a second conductive semiconductor layer, and having a first plane and a second plane opposing the first plane; first to third wavelength conversion units disposed on the first plane of the cell array to correspond to the first to third semiconductor light emitting units, respectively, and configured to convert a wavelength of light, emitted by the first to third semiconductor light emitting units, into a different wavelength of light to provide RGB light, respectively; a partition structure disposed in a space between the first to third wavelength conversion units so as to separate the first to third wavelength conversion units from each other; and first to third switching units spaced apart from the first to third wavelength conversion units within the partition structure, respectively, which are electrically connected to the first to third semiconductor light emitting units so as to selectively drive the first to third semiconductor light emitting units.

Also, according to these example embodiments, a light emitting device package includes a cell array, including a plurality of semiconductor light emitting units, each semiconductor light emitting unit having a first surface at a first vertical height (e.g., PL1) and a second surface opposite the first surface at a second vertical height (e.g., a surface at the bottom of electrode 129), and each semiconductor light emitting unit including a first conductive semiconductor layer, an active layer, and a second conductive semiconductor layer stacked on each other. The light emitting device package further includes a plurality of wavelength conversion units disposed respectively on the plurality of semiconductor light emitting units, each wavelength conversion unit having a first surface at the first vertical height and a second surface at a third vertical height (e.g., PL3), wherein the first vertical height is between the second vertical height and the third vertical height, each wavelength conversion unit configured to convert a wavelength of light, emitted by a respective one of the plurality of semiconductor light emitting units, into a different wavelength of light. The light emitting device package further includes a partition structure disposed in a space between the plurality of wavelength conversion units so as to separate the plurality of wavelength conversion units from each other, the partition structure extending between the first vertical height and the third vertical height (e.g., it can have one surface at the first vertical height and an opposite surface at the third vertical height), and a plurality of switching units spaced apart from the plurality of wavelength conversion units within the partition structure, and electrically connected to the plurality of semiconductor light emitting units so as to selectively drive the plurality of semiconductor light emitting units, each switching unit disposed between the first vertical height and the third vertical height (e.g., each switching unit can extend from the first vertical height toward the third vertical height).

Next, a method of manufacturing a light emitting device package according to an example embodiment of the present inventive concept will be described.

FIGS. 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, and 25B are schematic cross-sectional views of a process of manufacturing a light emitting device package. In more detail, the method of manufacturing a light emitting device package relates to a method of manufacturing a wafer-level chip scale package. Discussion of the above-mentioned process drawings, which illustrate enlarged cross sections of a portion of a light emitting device package, will help facilitate understanding of the current application.

Figure 13A:
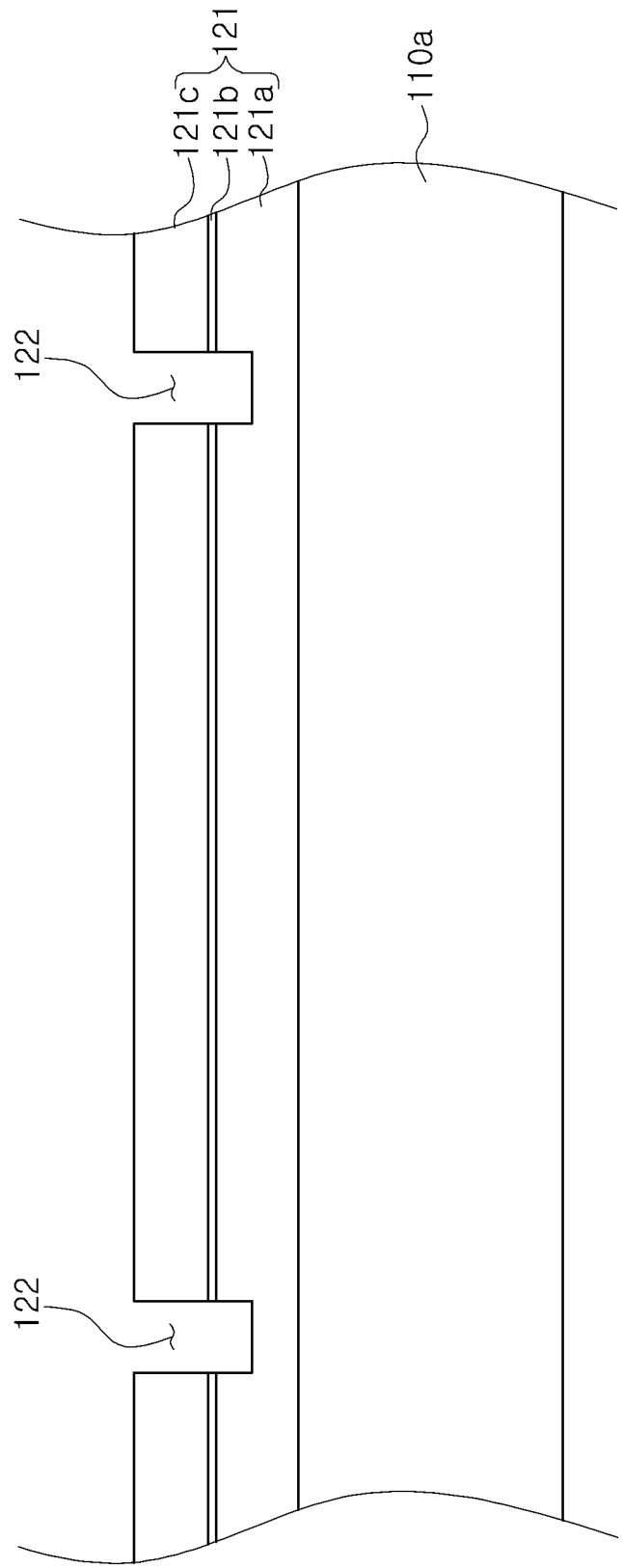
Figure 13B:
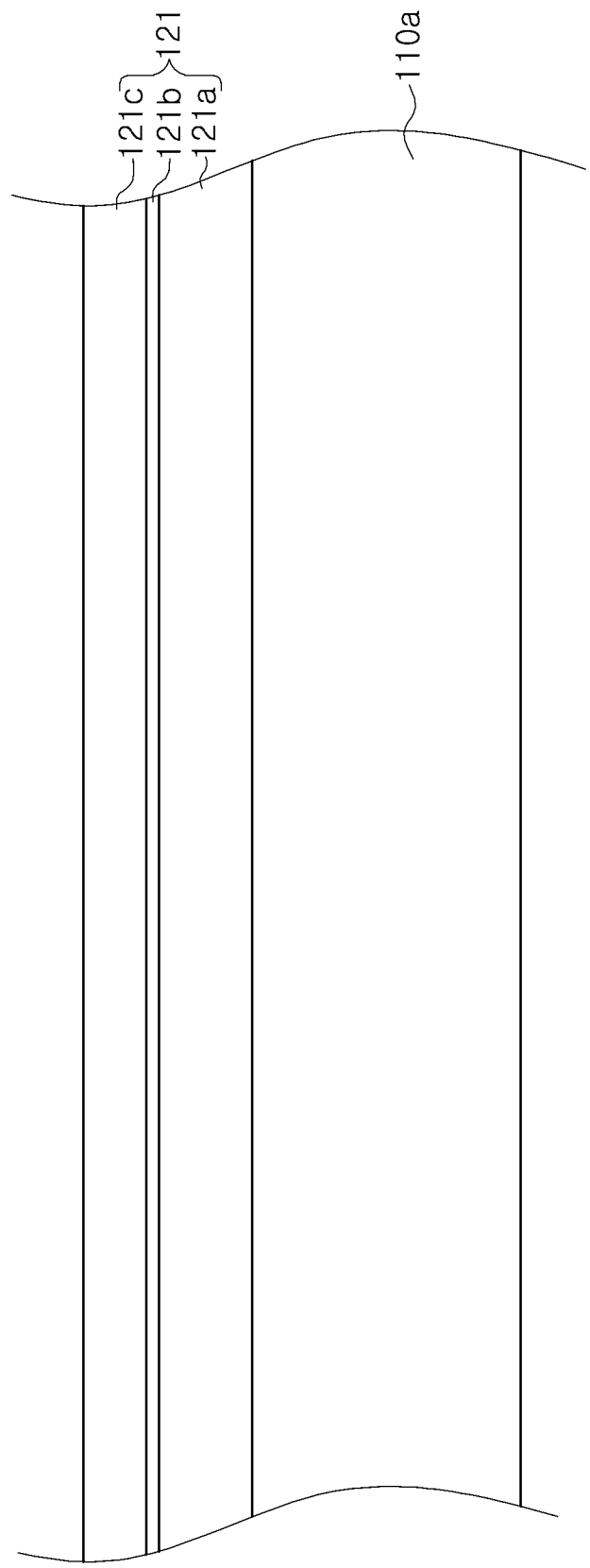

Referring to FIGS. 13A and 13B, the method of manufacturing a light emitting device package may start from forming, on a substrate for growth 110a, a light emitting structure 121 that may include a first conductive semiconductor layer 121a, an active layer 121b, and a second conductive semiconductor layer 121c.

The substrate for growth 110a may be an insulating, conductive, or semiconductor substrate, if necessary. The substrate for growth 110a may have the light emitting structure 121 formed on a surface thereof, and may be a semiconductor substrate on which a MOSFET may be formed by doping a region of the semiconductor substrate with an impurity. For example, the substrate for growth 110a may be a group IV semiconductor substrate or a group III-IV compound semiconductor substrate, such as a silicon (Si) substrate, an SiC substrate, or an SiGe substrate. The light emitting structure 121 may be an epitaxial layer of a group III nitride-based semiconductor layer formed on the substrate for growth 110a to form a plurality of light emitting regions. The first conductive semiconductor layer 121a may be, for example, a nitride semiconductor layer satisfying a composition of n-type $In_xAl_yGa_{1-x-y}N$ ($0 \leq x<1$, $0 \leq y<1$, $0 \leq x+y<1$), and an n-type impurity may be silicon (Si), germanium (Ge), selenium (Se), or tellurium (Te). The active layer 121b may have, for example, an MQW structure, in which quantum well layers and quantum barrier layers are alternately stacked with each other. For example, the quantum well layers and the quantum barrier layers may include different compositions of $In_xAl_yGa_{1-x-y}N$ ($0 \leq x \leq 1$, $0 \leq y \leq 1$, $0 \leq x+y \leq 1$), respectively. In a certain example, the quantum well layers may include a composition of $In_xGa_{1-x}N$ ($0<x \leq 1$), and the quantum barrier layers may include GaN or AlGaN. The second conductive semiconductor layer 121c may be, for example, a nitride semiconductor layer satisfying a composition of p-type $In_xAl_yGa_{1-x-y}N$ ($0 \leq x<1$, $0 \leq y<1$, $0 \leq x+y<1$), and a p-type impurity may be magnesium (Mg), zinc (Zn), or beryllium (Be).

Subsequently, the light emitting structure 121 may be etched to expose a region of the first conductive semiconductor layer 121a, forming a mesa-etched region 122 in the light emitting structure 121.

The etching process may be performed as a process of removing regions of the second conductive semiconductor layer 121c and the active layer 121b. An electrode may be formed in the region of the first conductive semiconductor layer 121a exposed by the mesa-etched region 122.

Figure 14A:
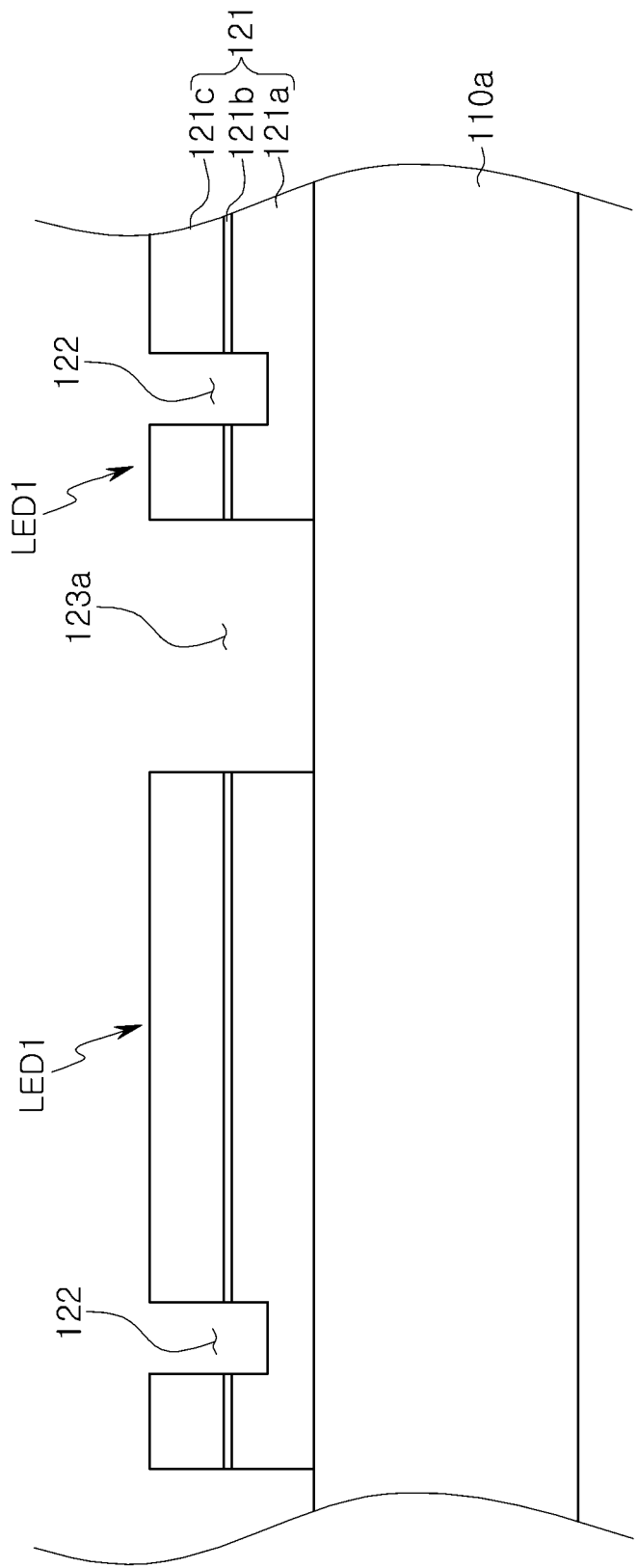
Figure 14B:
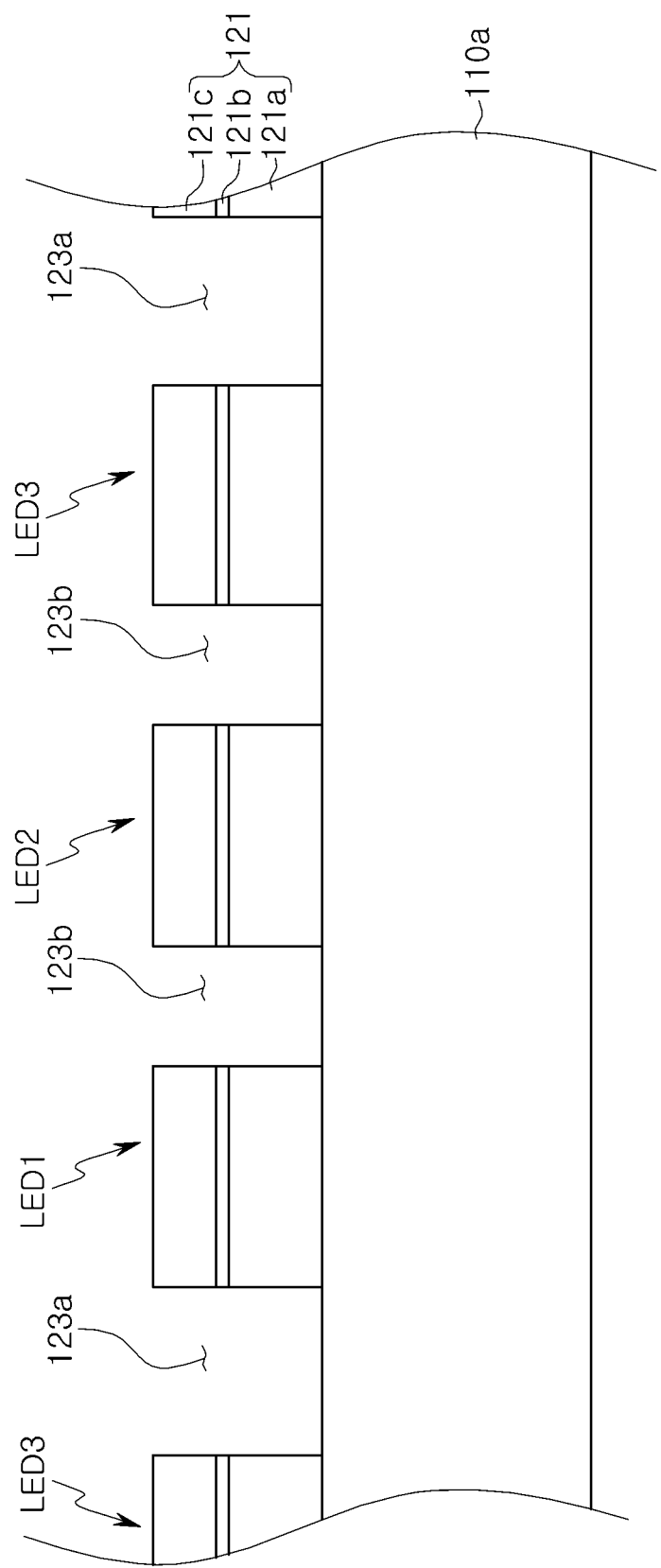

As illustrated in FIGS. 14A and 14B, an isolation process of dividing the light emitting structure 121 into a plurality of light emitting regions may be performed.

Referring to FIG. 14A, an isolation region 123a may be formed through the removal of a portion of the light emitting structure 121 to expose a surface of the substrate for growth 110a. Such a process may allow the light emitting structure 121 to be divided into a plurality of light emitting regions, and may be supported by the substrate for growth 110a.

Referring to FIG. 14B, the isolation region 123a may be formed in every three light emitting regions. A sub-isolation region 123b may be formed in a space between three light emitting regions. Such an isolation process may include a process of forming the isolation region 123a by using a blade, but the present inventive concept is not limited thereto. The sub-isolation region 123b may be formed using a separate process different from a process of forming the isolation region 123a, but also may be formed using the same process as the process of forming the isolation region 123a. The sub-isolation region 123b may be narrower than the isolation region 123a.

Figure 15B:
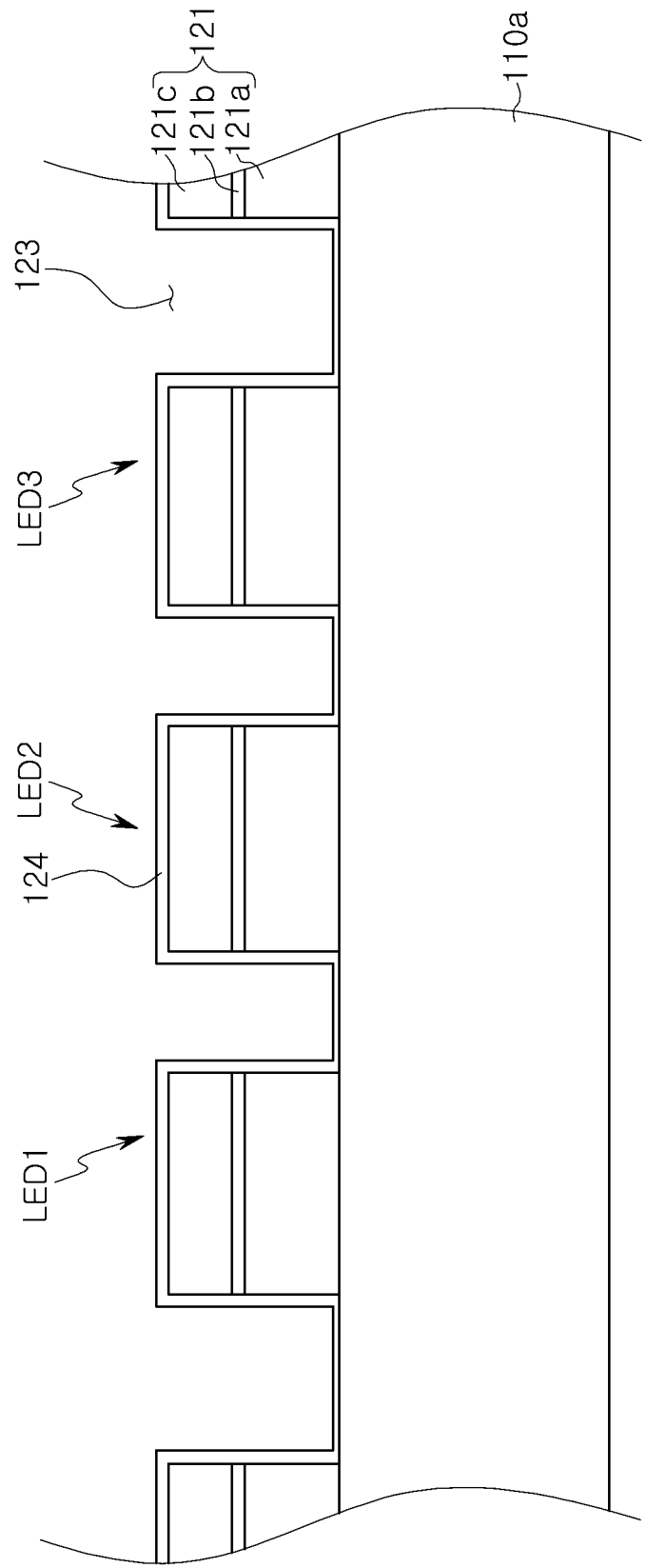

Subsequently, referring to FIGS. 15A and 15B, an insulating layer 124 may be deposited to cover the light emitting structure 121 and the surface of the substrate for growth 110a.

Figure 16A:
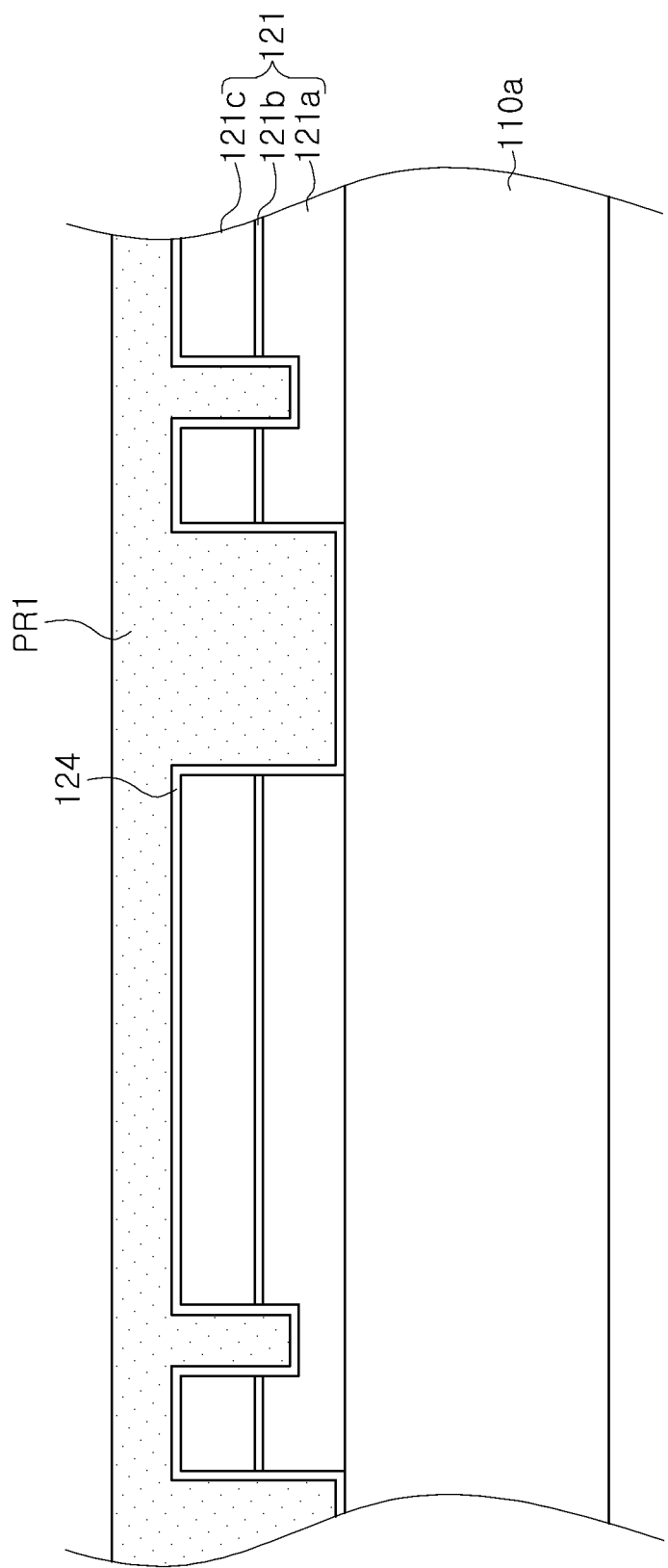
Figure 16B:
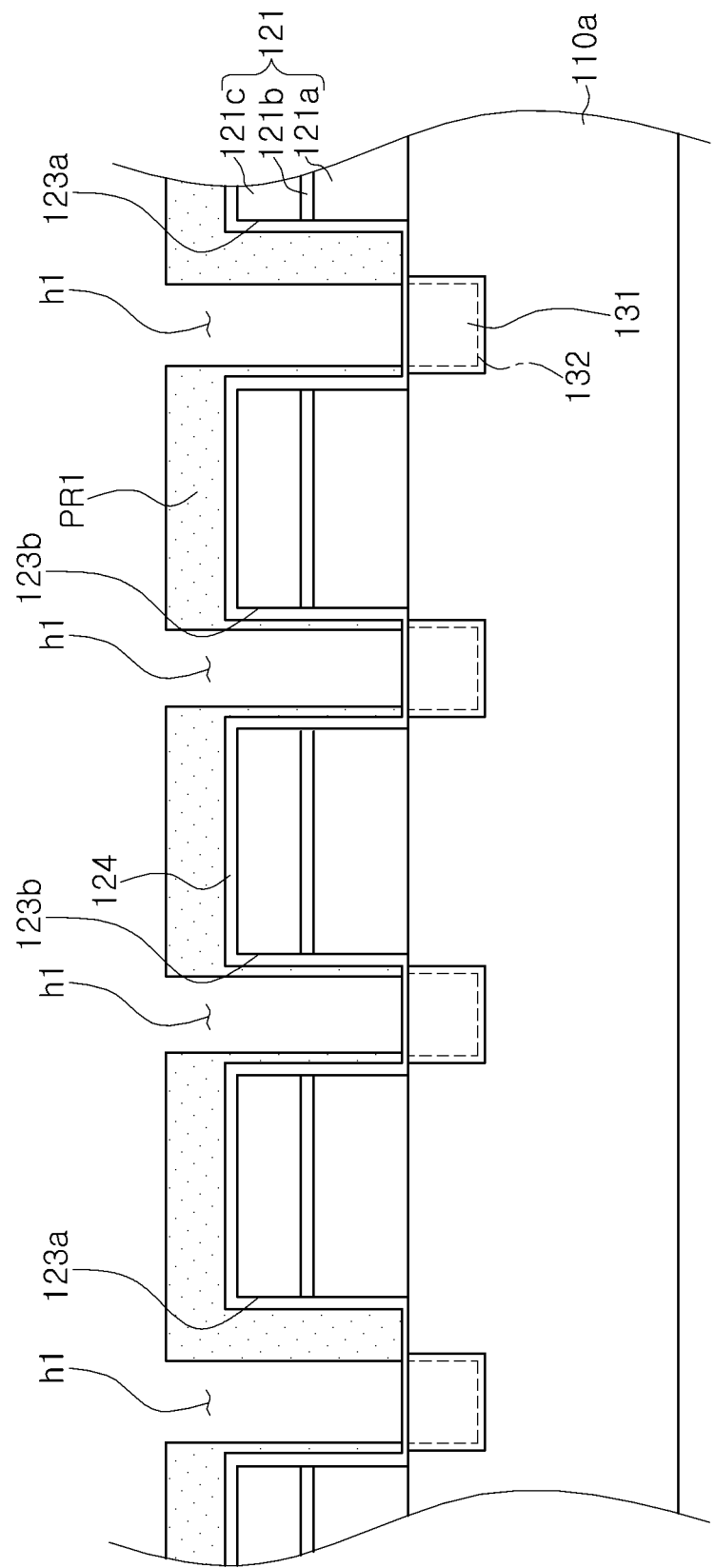

Subsequently, referring to FIGS. 16A and 16B, a first photoresist layer PR1 may be applied to cover the insulating layer 124, an opening h1 may be formed to expose a region of both the isolation region 123a and the sub-isolation region 123b, and a p-well region 131 may be formed by injecting a p-type impurity into both the isolation region 123a and the sub-isolation region 123b. Prior to the formation of the p-well region 131, an n-type pocket 132 may also be formed on the circumference of a region in which the p-well region 131 may be formed by injecting an n-type impurity. After the p-well region 131 is formed, the first photoresist layer PR1 may be removed.

Figure 17A:
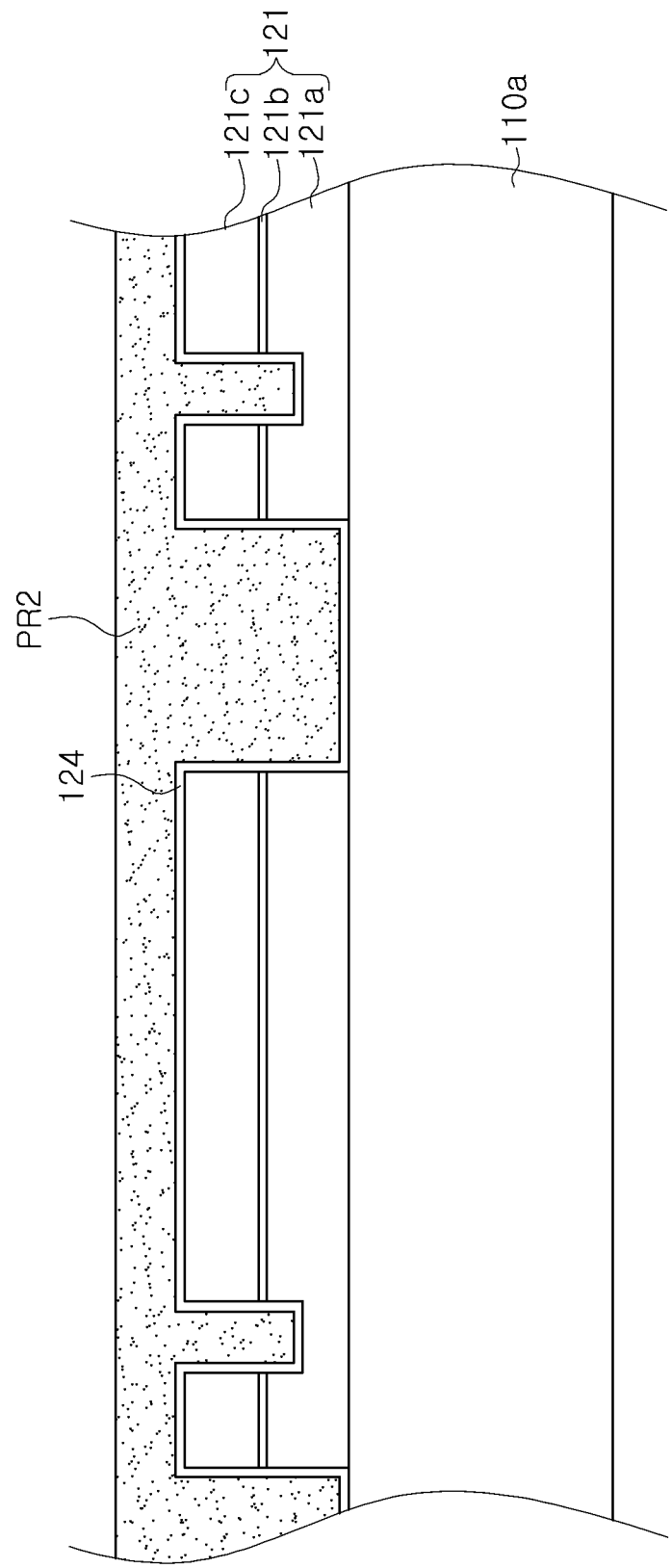
Figure 17B:
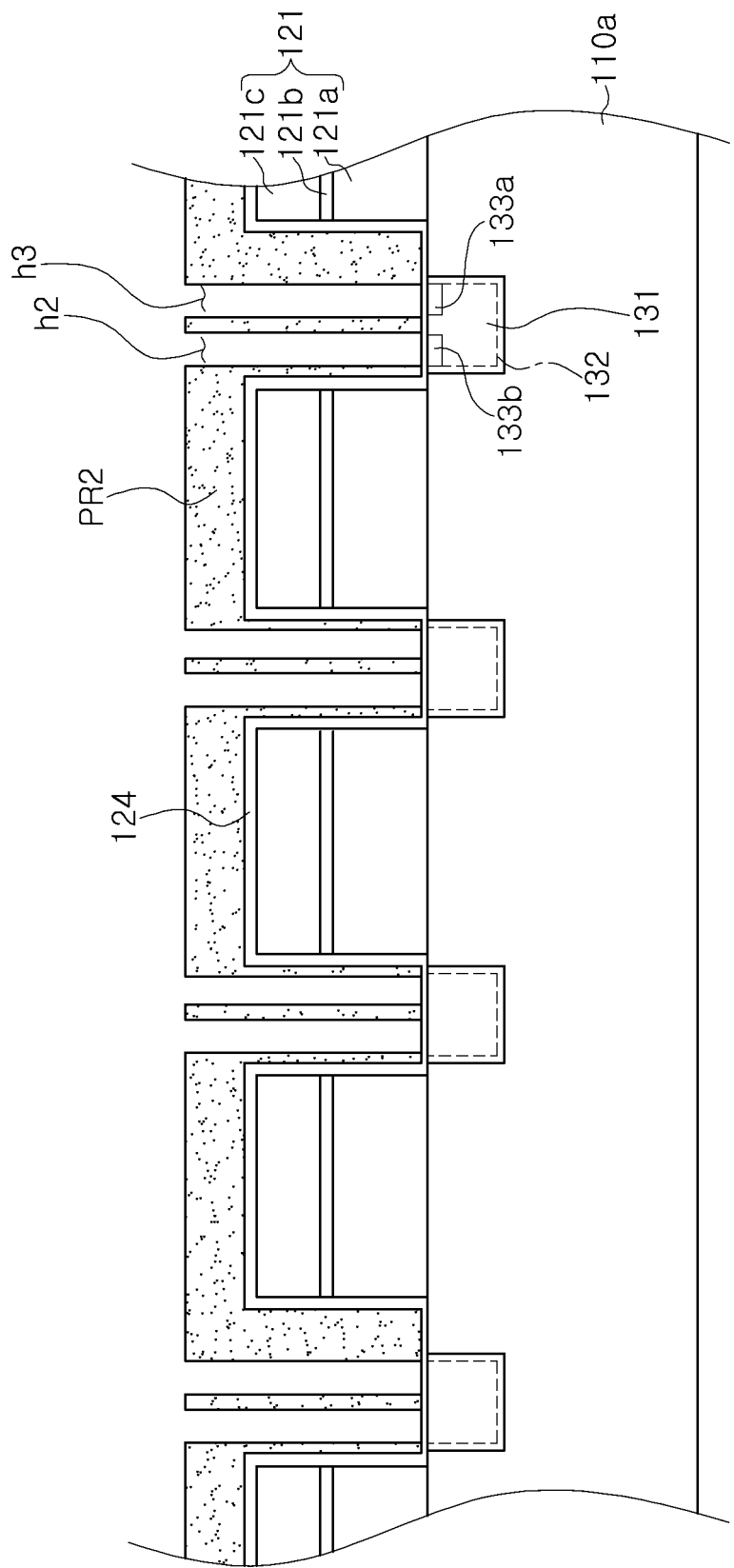

Subsequently, referring to FIGS. 17A and 17B, a second photoresist layer PR2 may be applied to cover the insulating layer 124, and openings h2 and h3 may be formed to form n-well regions 133a and 133b within the p-well region 131. After the n-well regions 133a and 133b are formed, the second photoresist layer PR2 may be removed. According to an example embodiment, the insulating layer 124 may also be removed and then redeposited.

Figure 18A:
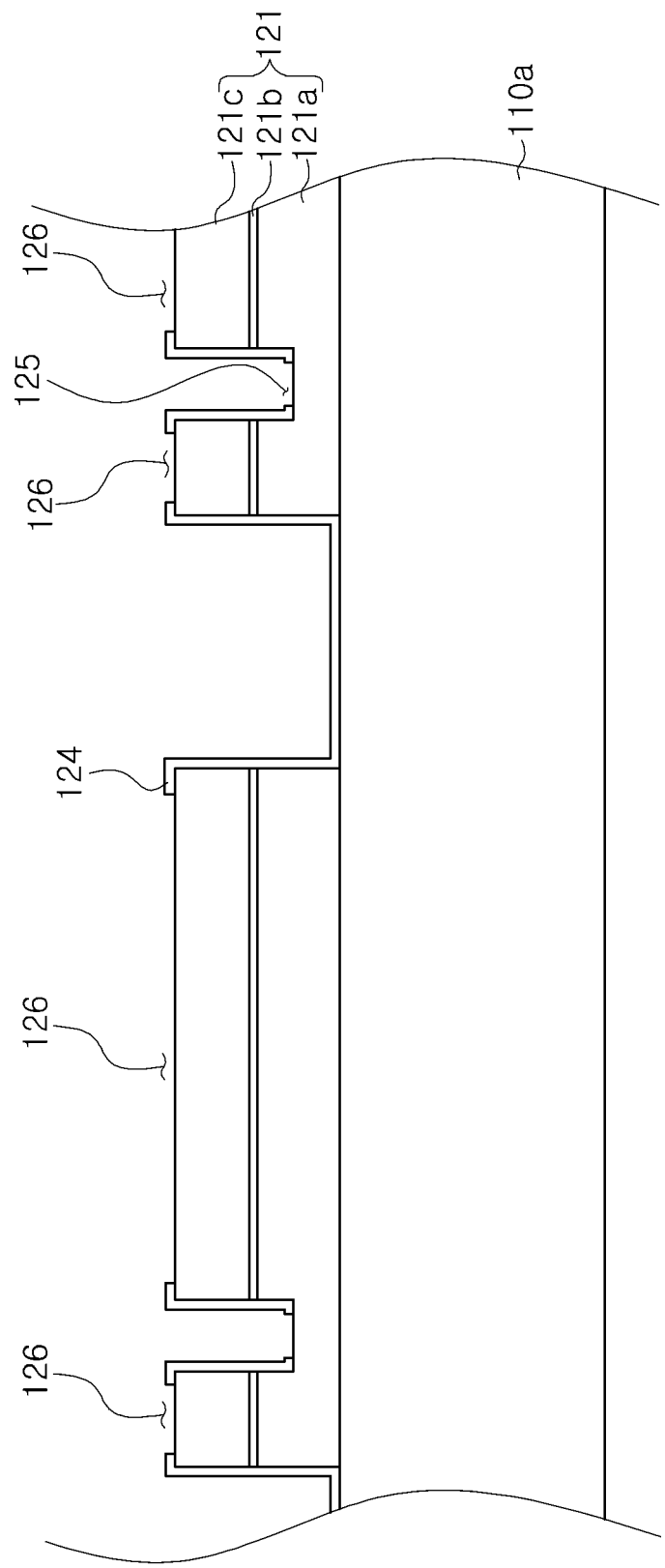
Figure 18B:
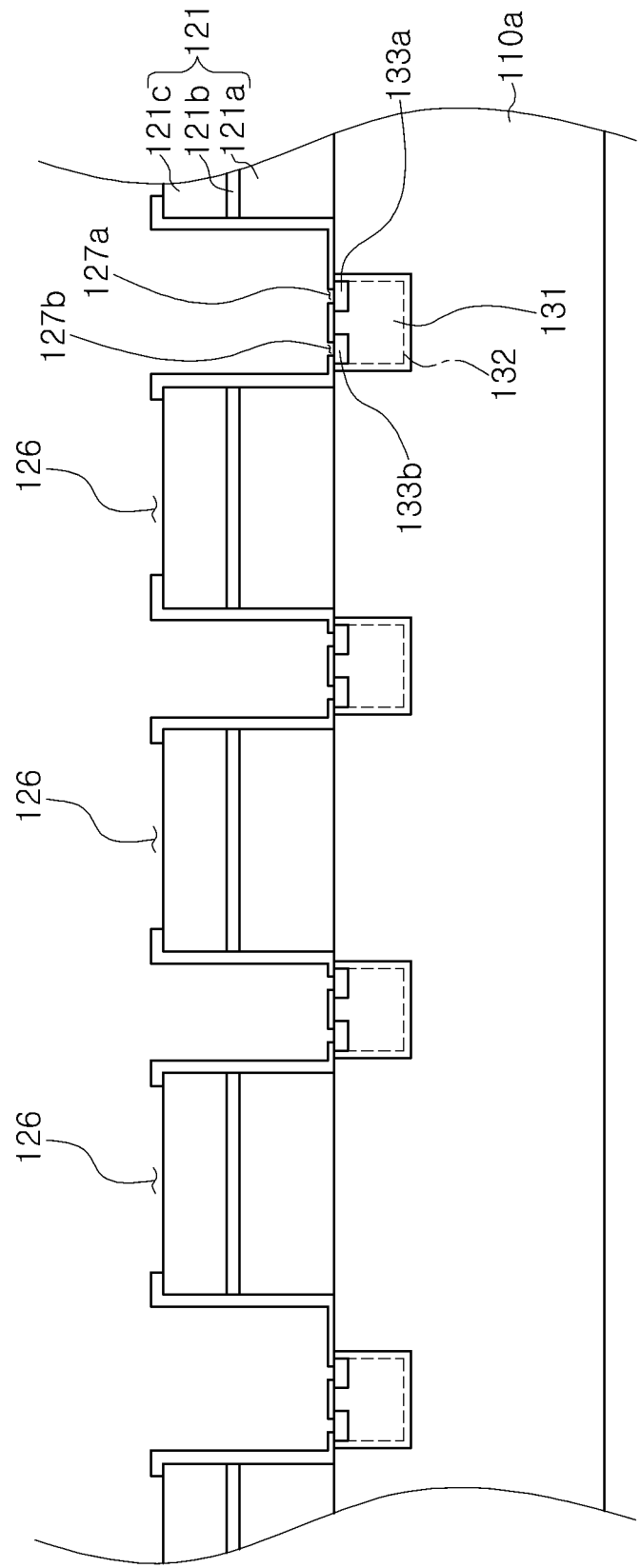
Figure 19A:
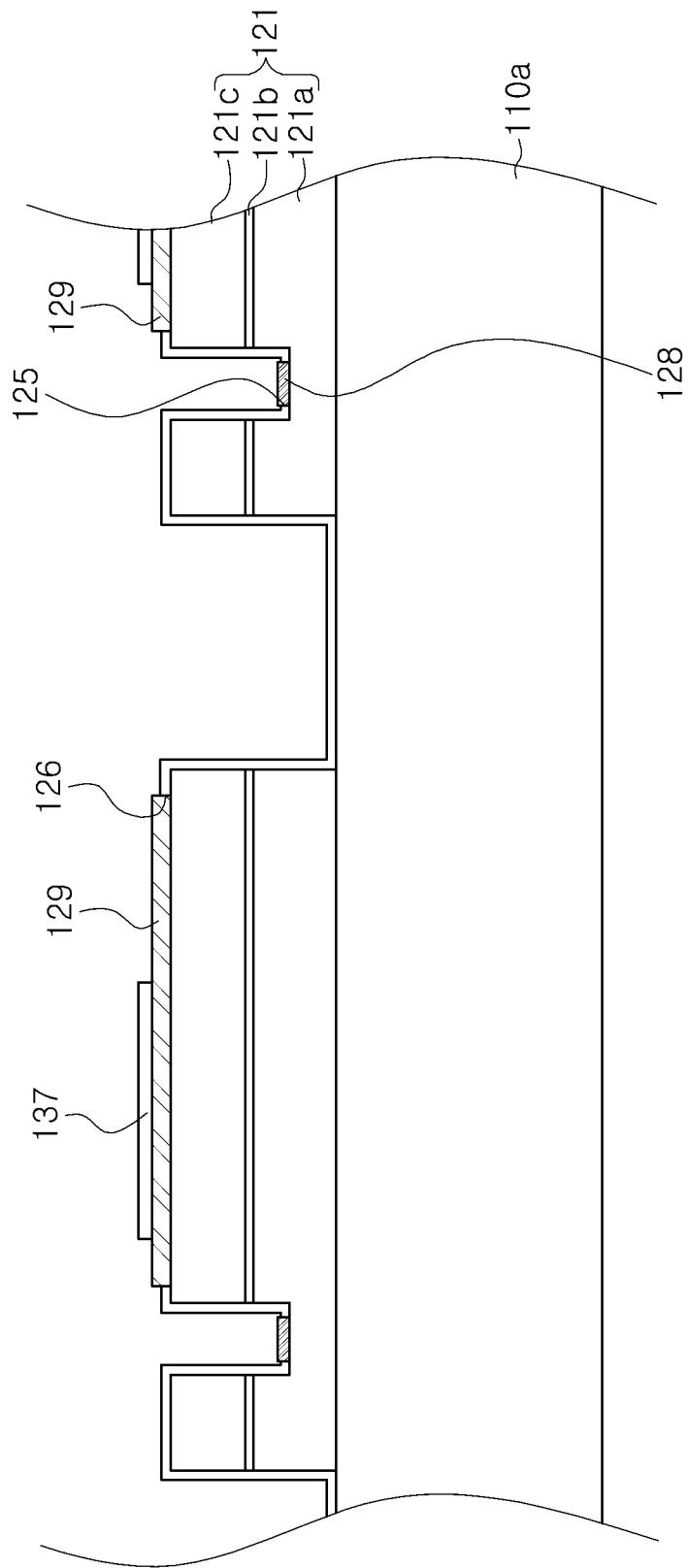
Figure 19B:
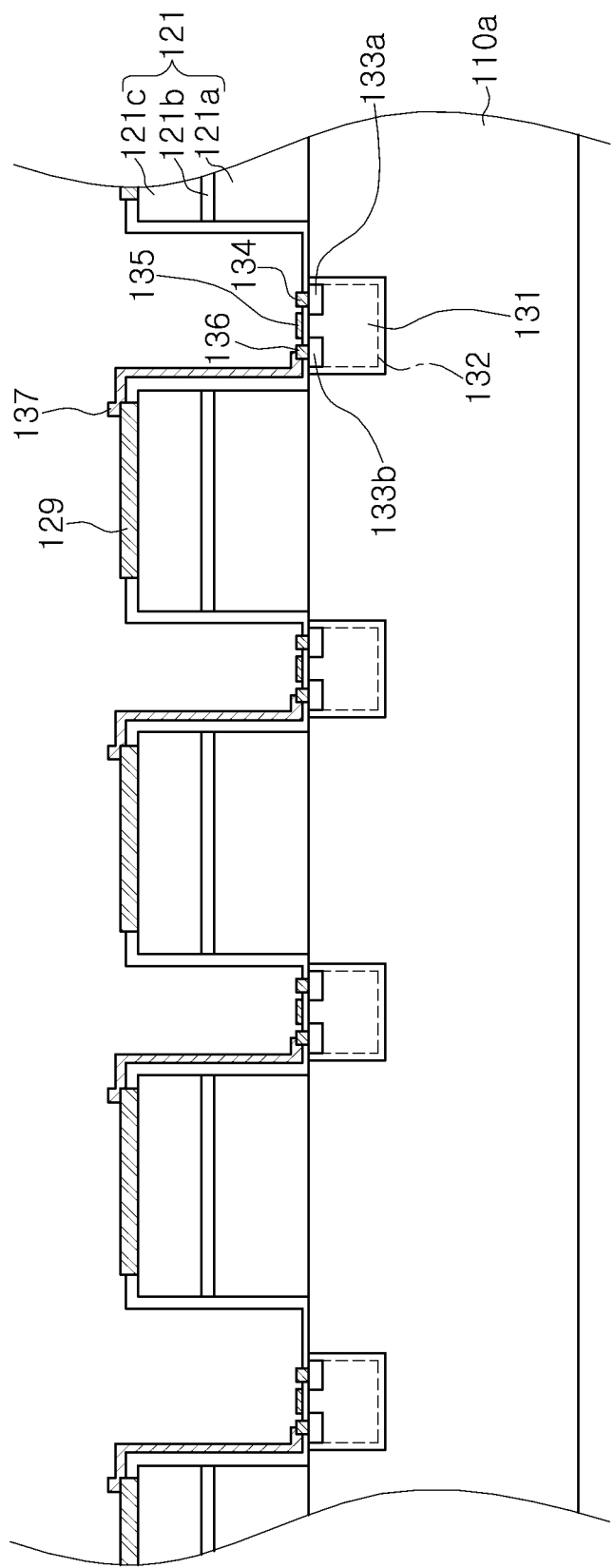

Referring to FIGS. 18A and 18B, openings 125, 126, 127a, and 127b may be formed by removing regions of the insulating layer 124. Further, as illustrated in FIGS. 19A and 19B, a first electrode 128, a second electrode 129, a drain electrode 134, and a source electrode 136 may be formed by depositing a conductive material in the openings 125, 126, 127a, and 127b. Each of the first and second electrodes 128 and 129 may be a reflective electrode including at least one of silver (Ag), aluminum (Al), nickel (Ni), chromium (Cr), copper (Cu), gold (Au), palladium (Pd), platinum (Pt), tin (Sn), tungsten (W), rhodium (Rh), iridium (Ir), ruthenium (Ru), magnesium (Mg), and zinc (Zn), or alloys thereof. A connecting electrode 137 may be formed to electrically connect the source electrode 136 to the second electrode 129. After the source electrode 136 and the second electrode 129 are formed, the connecting electrode 137 may be formed to connect the source electrode 136 to the second electrode 129, but the present inventive concept is not limited thereto, and the source electrode 136, the second electrode 129, and the connecting electrode 137 may also be formed integrally with each other. A gate electrode 135 may be formed on a gate insulating layer 124a. The gate electrode 135 may include, for example, at least one of doped silicon (Si), tungsten (W), TiN, or alloys thereof.

Figure 20A:
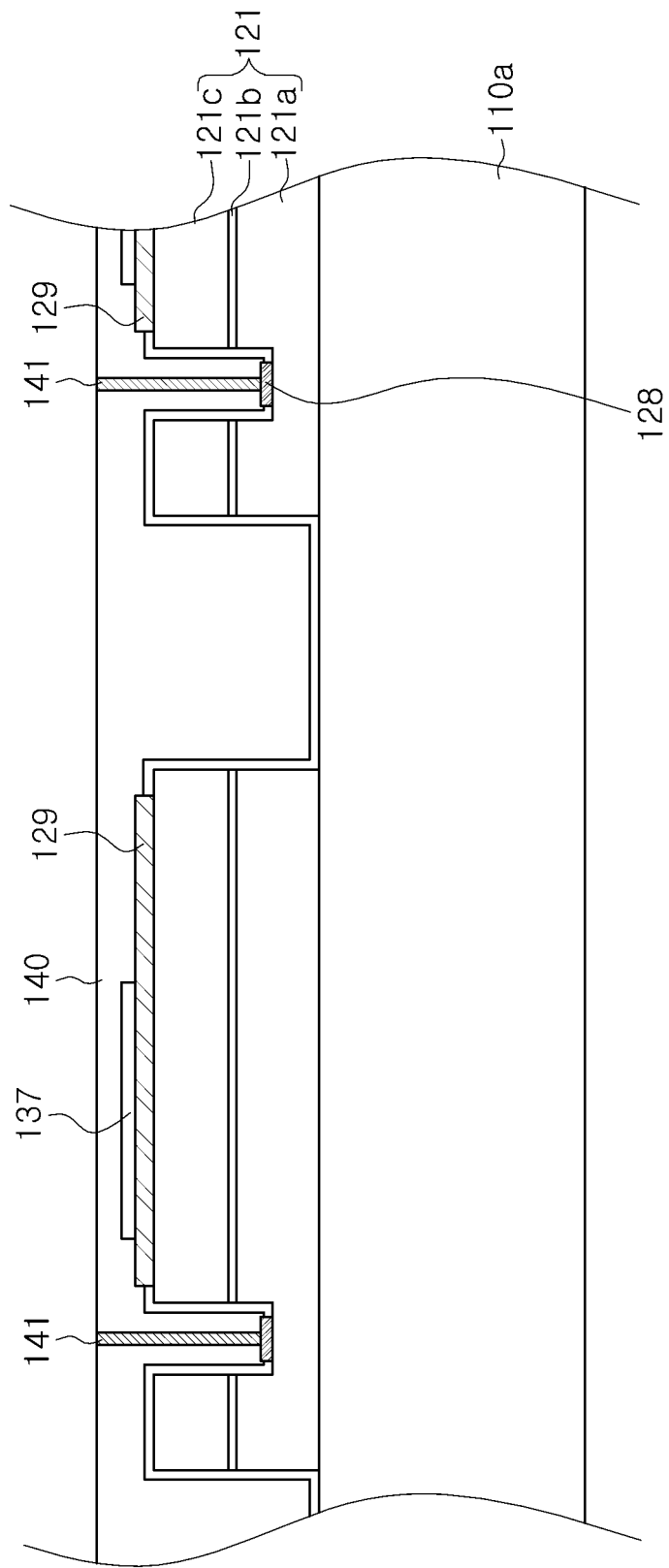
Figure 20B:
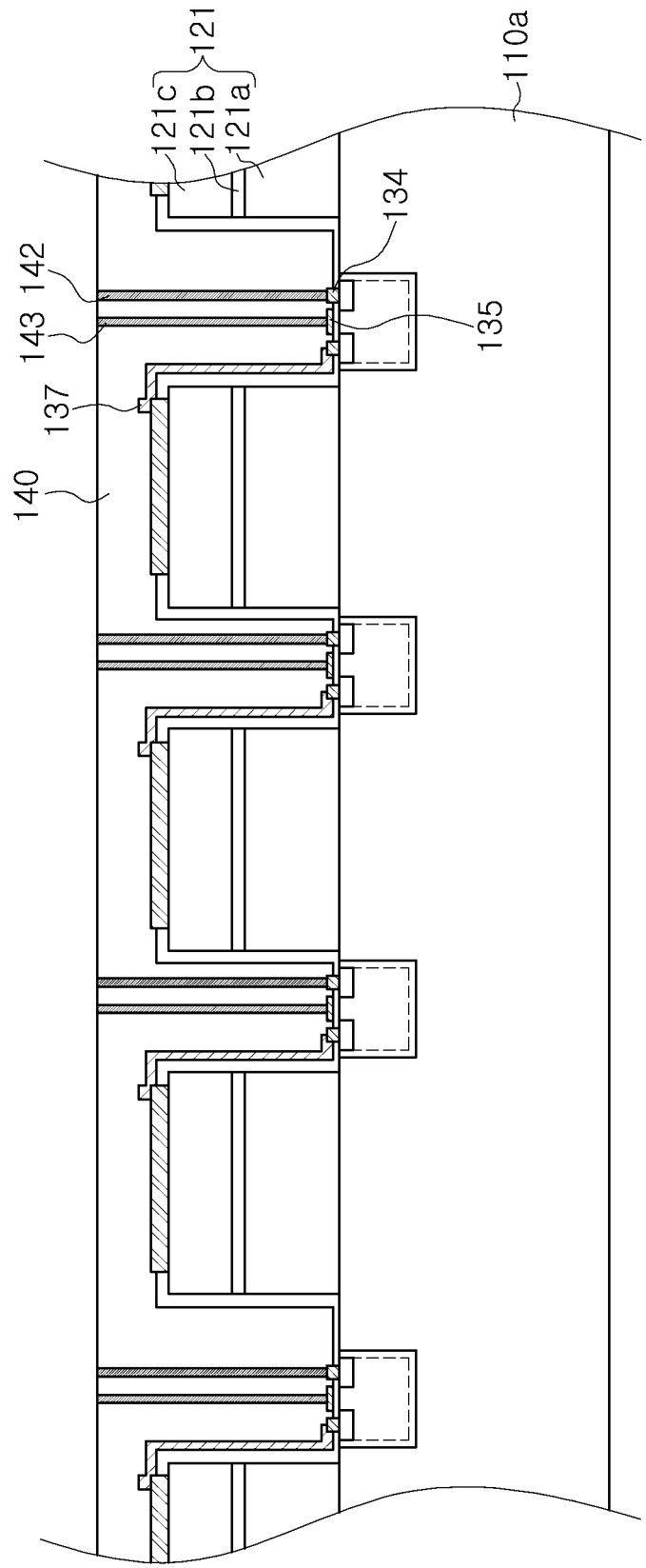

Subsequently, as illustrated in FIGS. 20A and 20B, first to third conductive vias 141 to 143 may be formed on the first electrode 128, the drain electrode 134, and the gate electrode 135, respectively, and a molding unit 140 may be formed to cover the first to third semiconductor light emitting units LED1 to LED3.

Figure 21A:
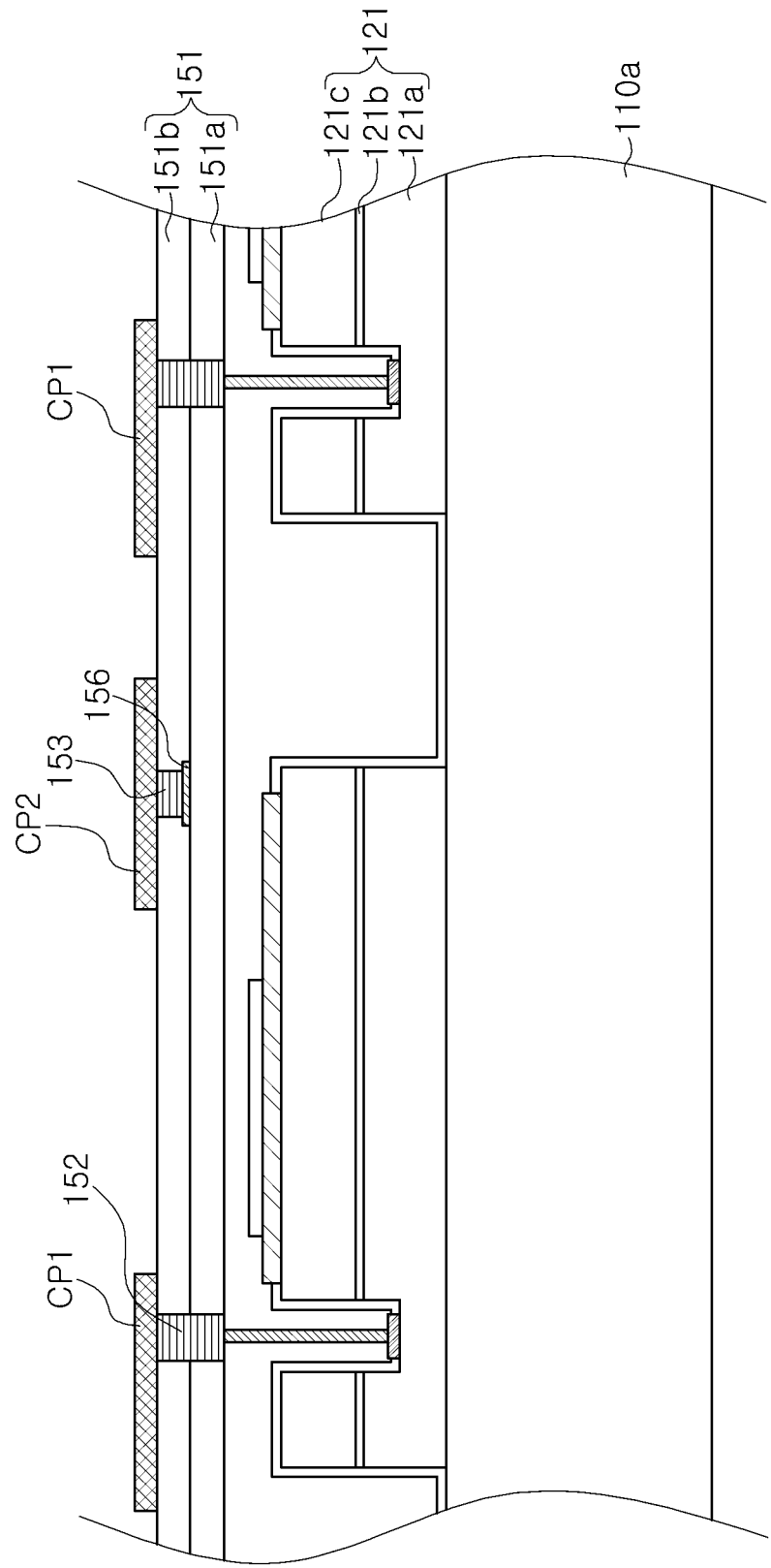
Figure 21B:
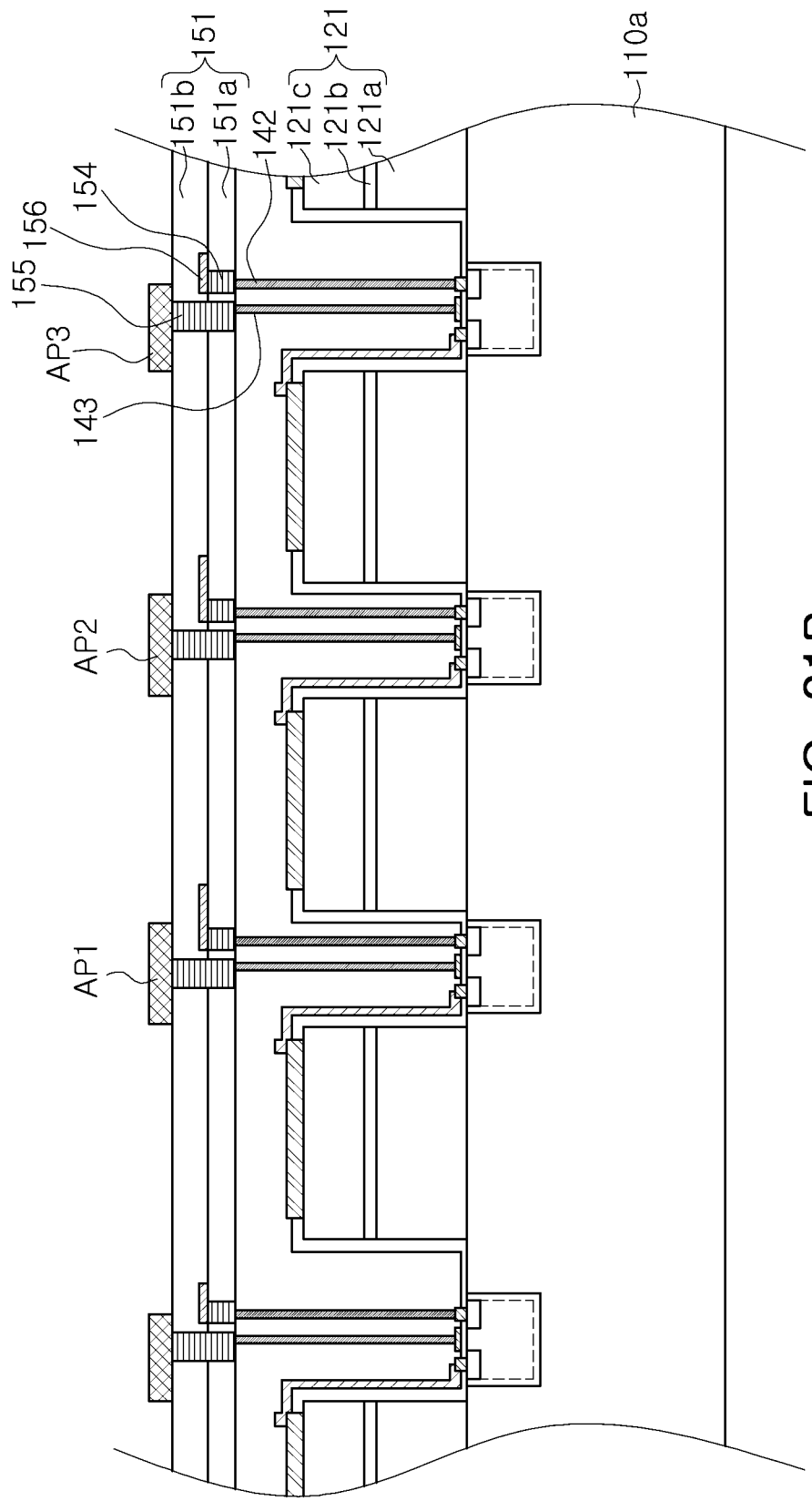

Thereafter, as illustrated in FIGS. 21A and 21B, a multilayer circuit board 151 may be disposed to connect the first to third conductive vias 141 to 143 to common electrode pads CP1 and CP2 and separate electrode pads AP1, AP2, and AP3. The multilayer circuit board 151 may include a plurality of PCBs 151a and 151b that may be stacked, and the PCBs 151a and 151b may include a through electrode 154 and a wiring 156. The multilayer circuit board 151 may have the common electrode pads CP1 and CP2 and the separate electrode pads AP1, AP2, and AP3 disposed on a surface thereof.

Figure 22A:
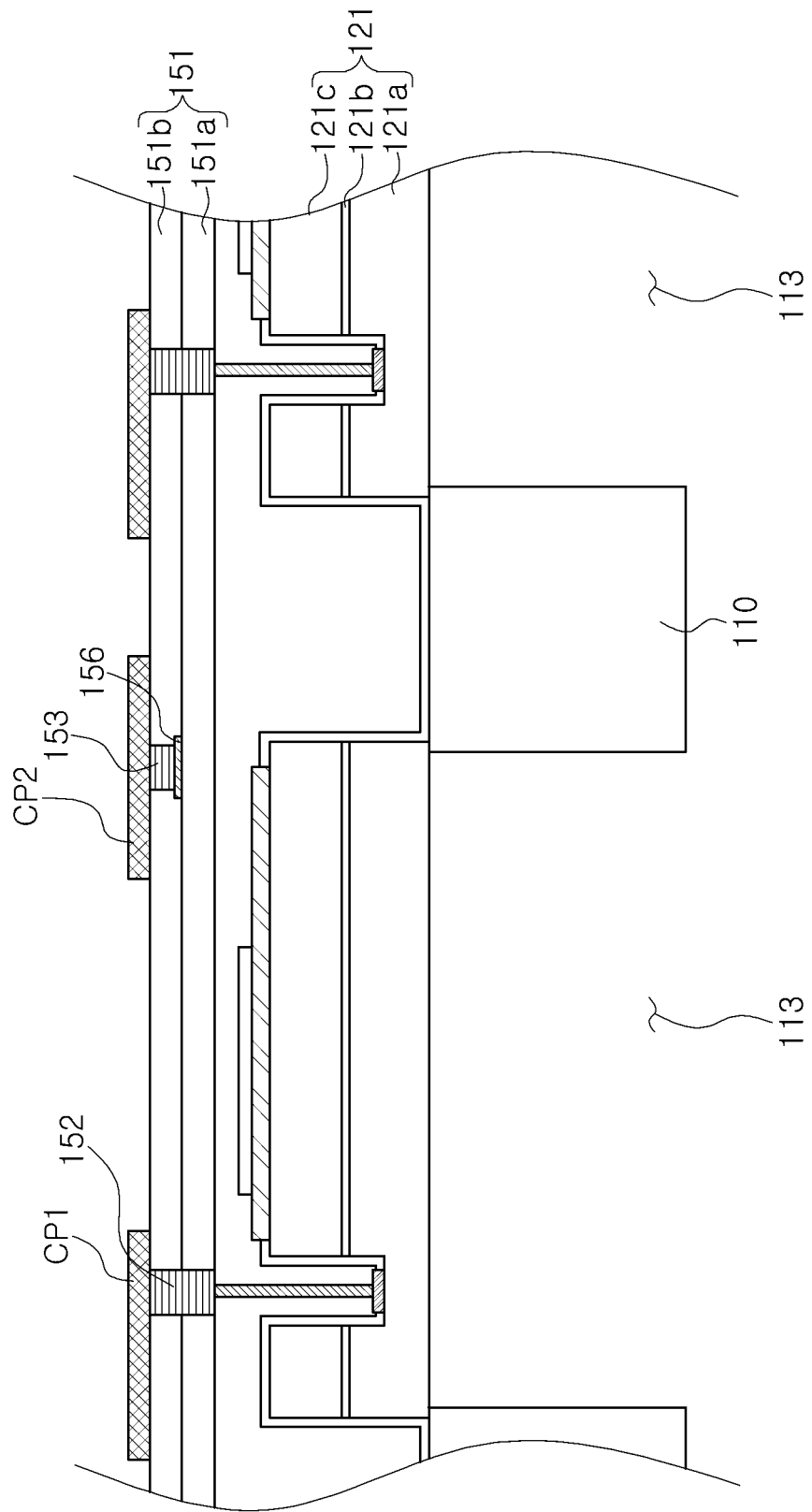
Figure 22B:
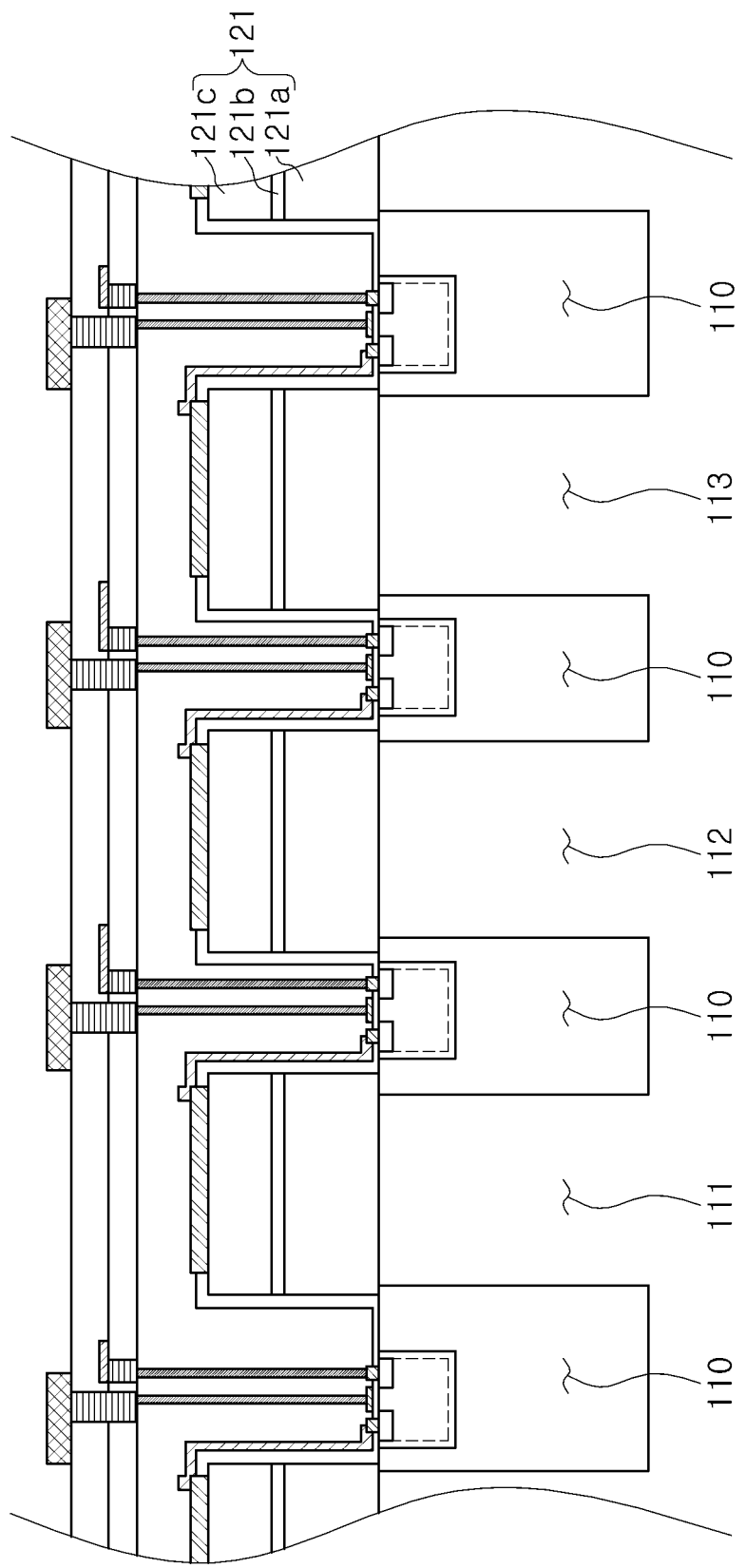

Subsequently, as illustrated in FIGS. 22A and 22B, first to third light emitting windows 111 to 113 may be formed by etching regions of the substrate for growth 110a, corresponding to the first to third semiconductor light emitting units LED1 to LED3.

Figure 23A:
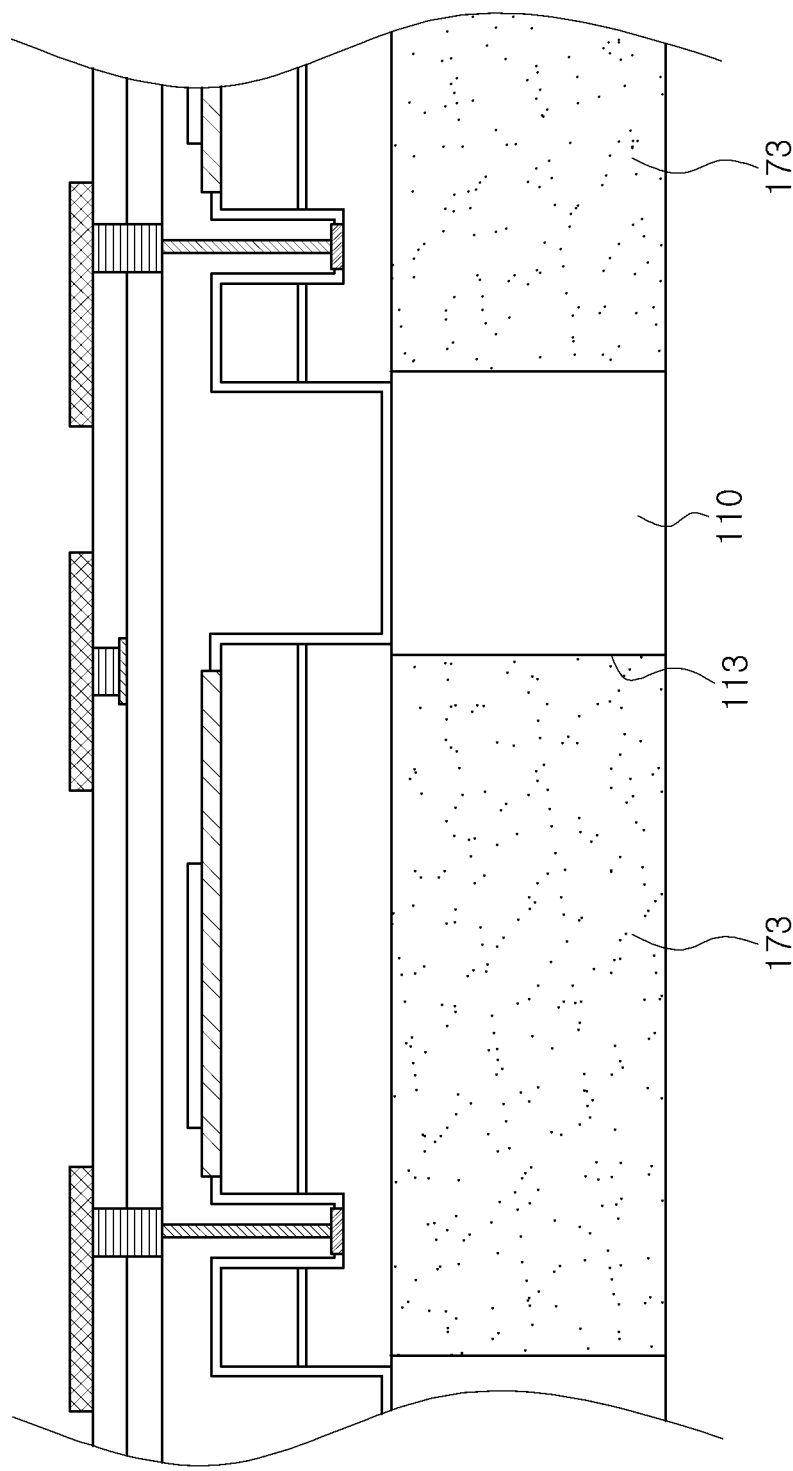
Figure 23B:
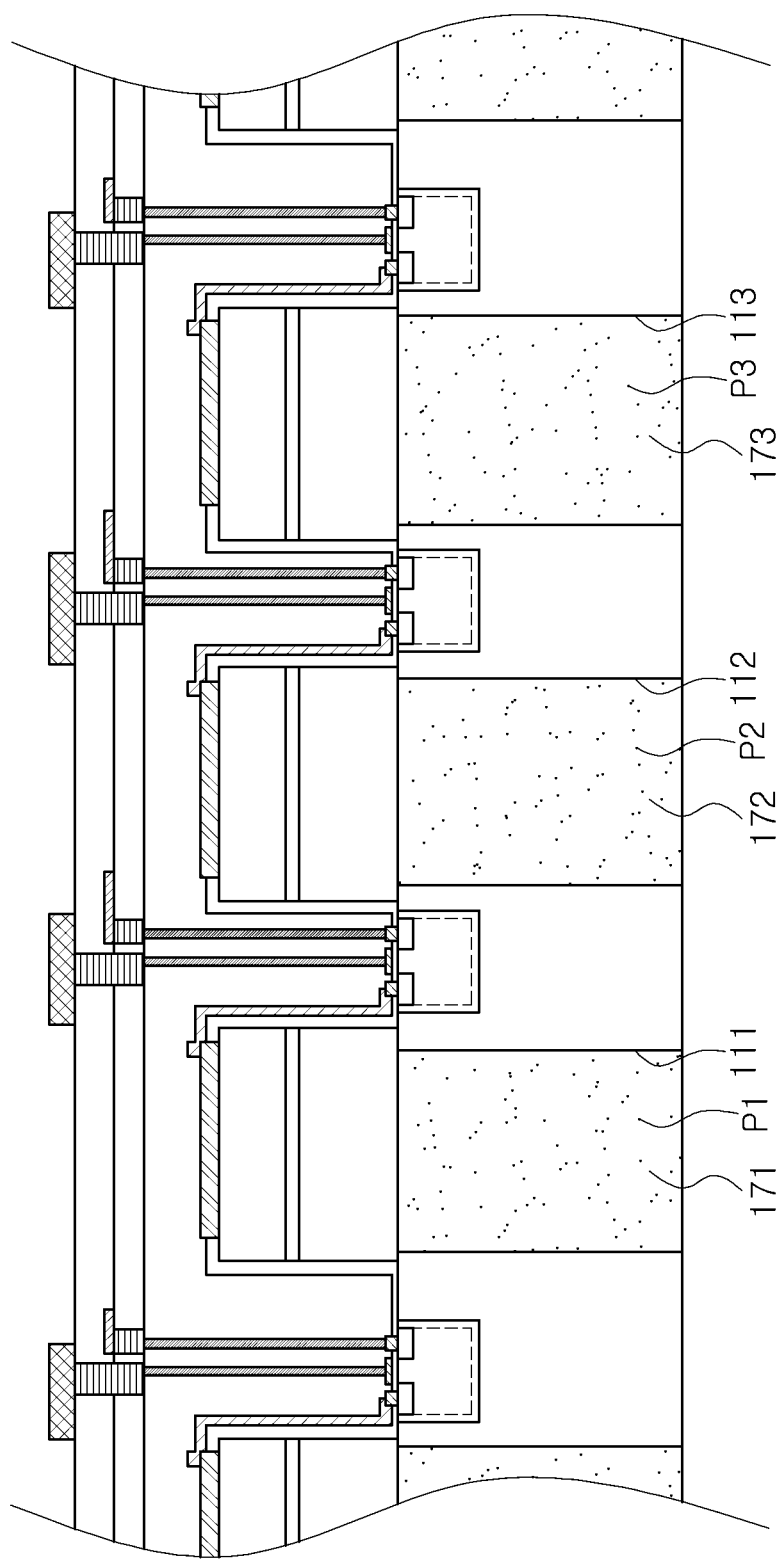

In the next step, as illustrated in FIGS. 23A and 23B, second and third wavelength conversion units 172 and 173 may be formed by dispensing a light-transmitting liquid resin, in which a wavelength conversion material is mixed, such as a green or red phosphor P2 or P3, in the second and third light emitting windows 112 and 113, and a first wavelength conversion unit 171 may be formed by dispensing a light-transmitting liquid resin, in which a phosphor is not mixed, in the first light emitting window 111. According to an example embodiment, the first wavelength conversion unit 171 may include a blue or blue-green phosphor P1 (for example, wavelength: 480 nm to 520 nm) for adjusting color coordinates of blue light.

Figure 24A:
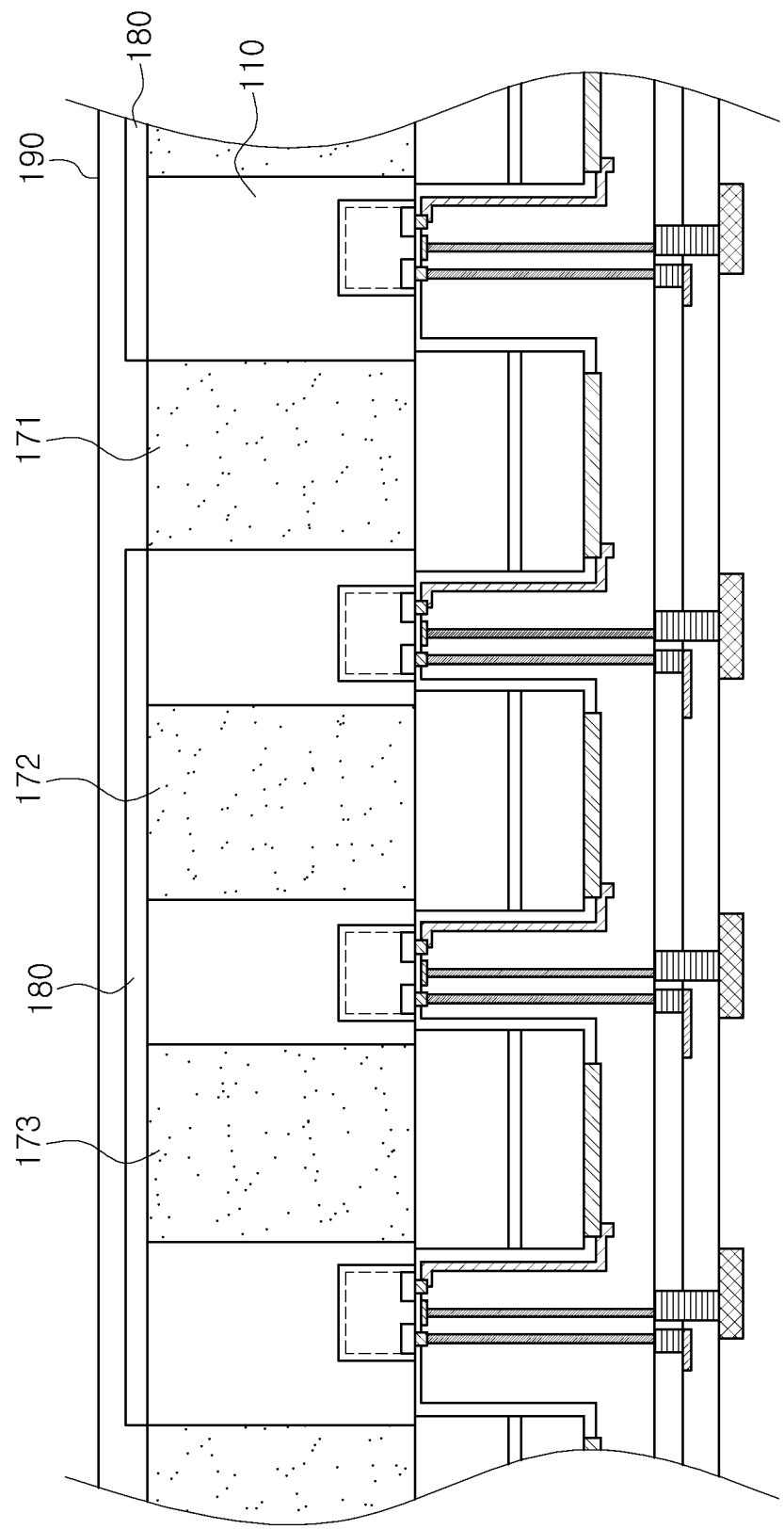
Figure 24B:
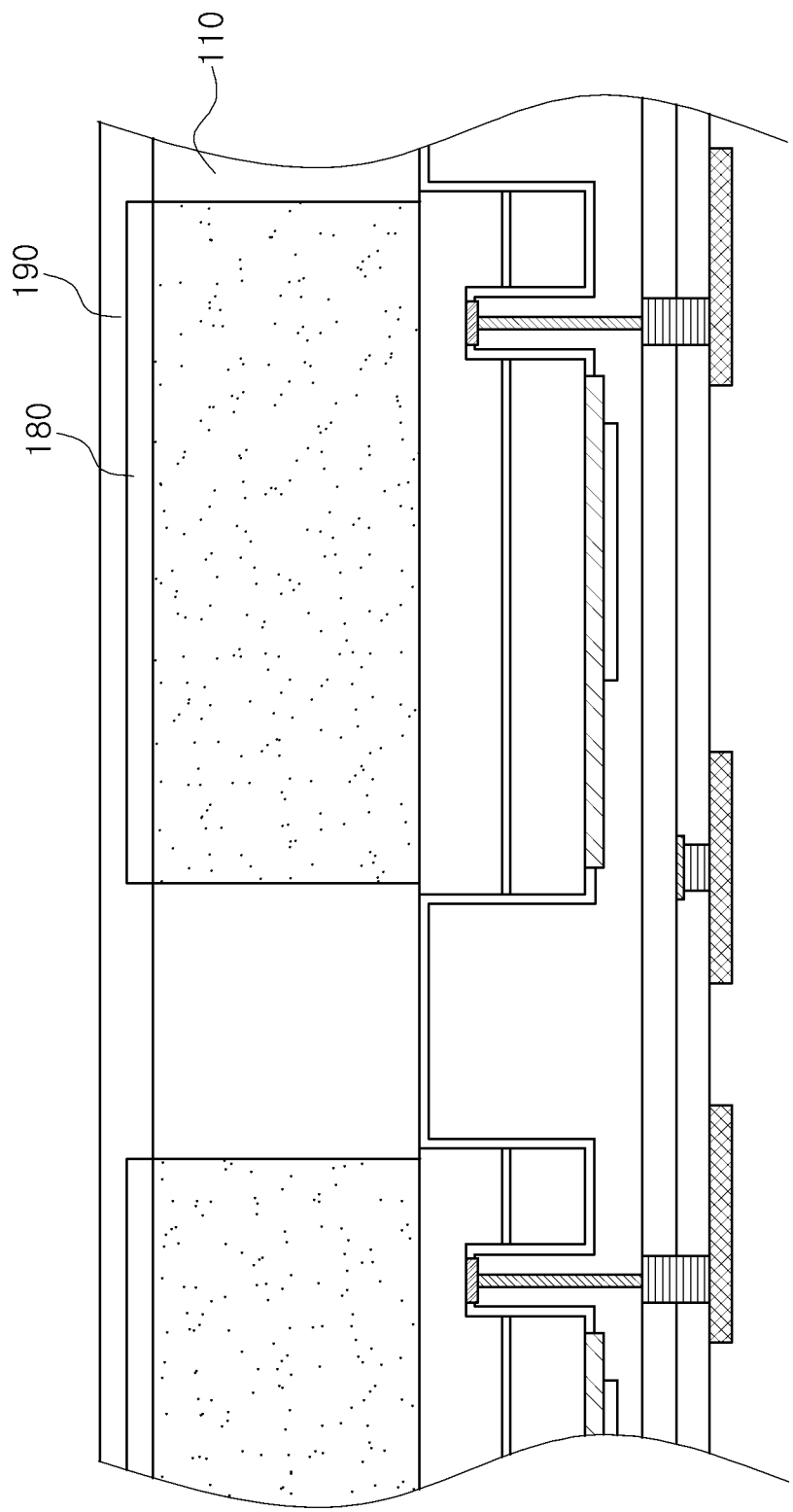

Subsequently, referring to FIGS. 24A and 24B, a light filtering layer 180 may be disposed on the second and third wavelength conversion units 172 and 173, and an encapsulation unit 190 may be formed on the first to third wavelength conversion units 171 to 173 to prevent degradation of the phosphor.

Figure 25A:
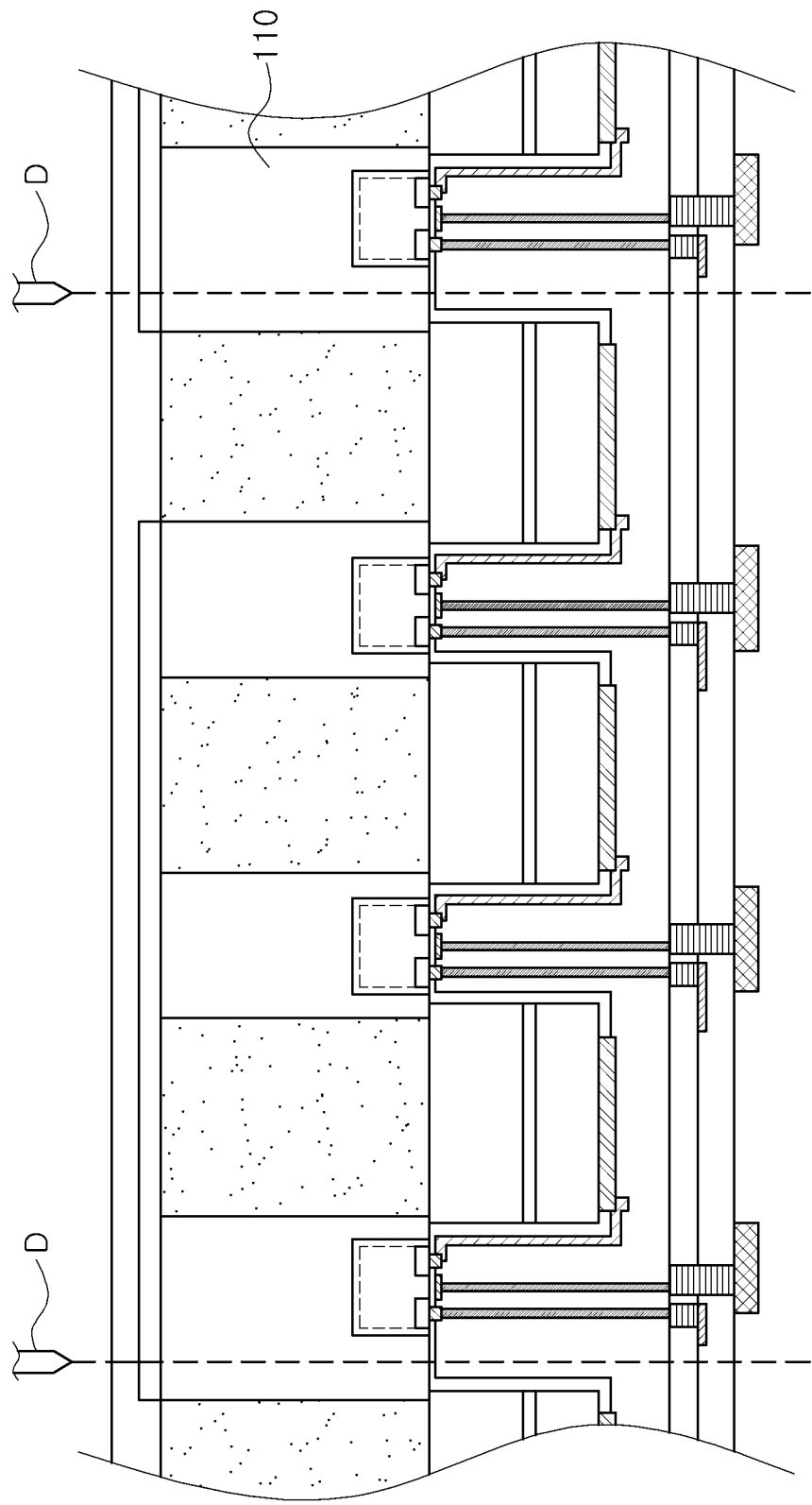

At this point, as illustrated in FIGS. 25A and 25B, the light emitting device package 100, illustrated in FIGS. 5 and 6, may be manufactured by cutting the semiconductor light emitting device into separate semiconductor light emitting device units, using a blade D.

Figure 26:
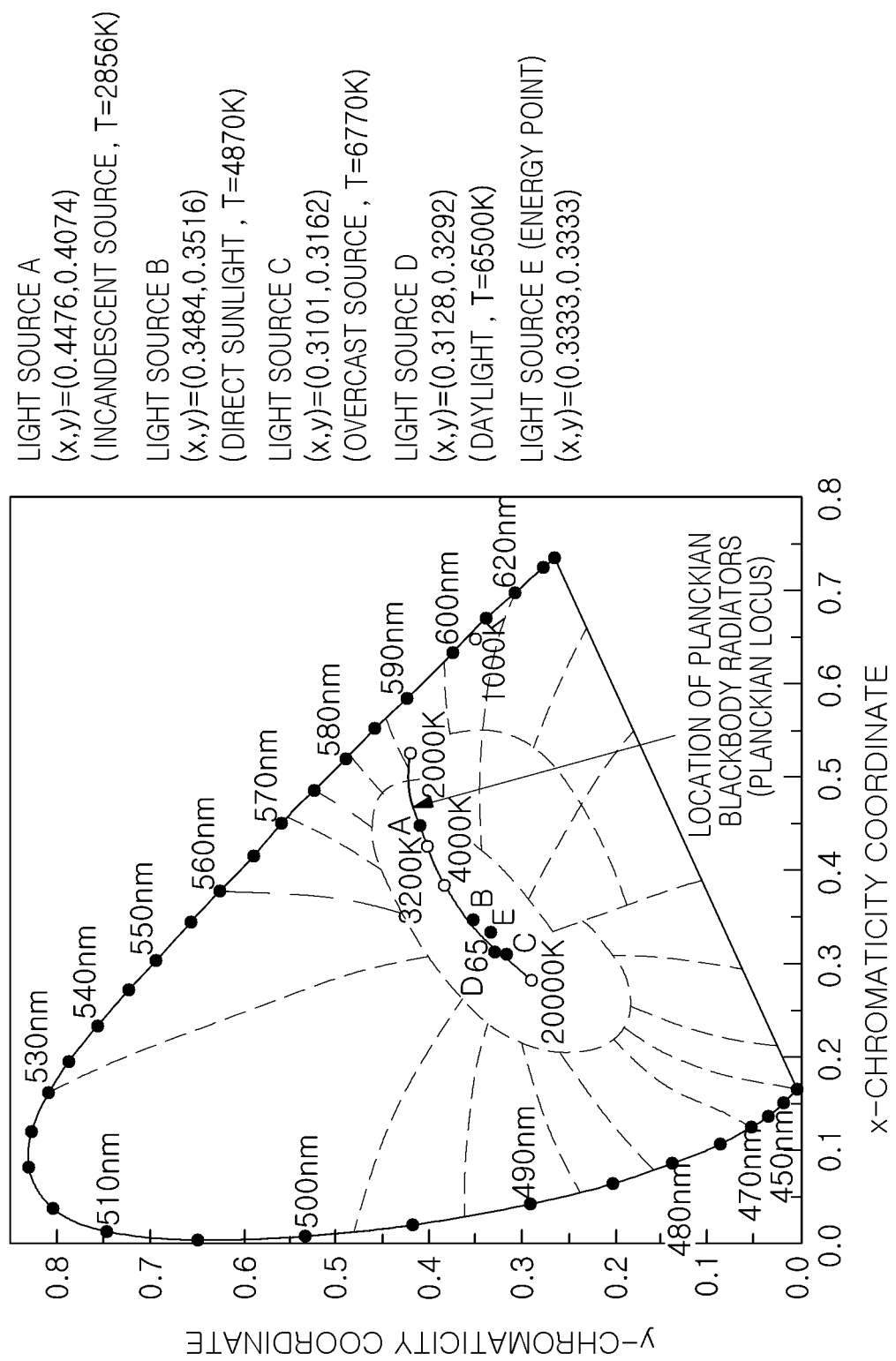
FIG. 26 is a CIE 1931 color space chromaticity diagram illustrating a wavelength conversion material employable in a light source module according to an example embodiment of the present inventive concept.

FIG. 26 is a CIE 1931 color space chromaticity diagram illustrating a wavelength conversion material employable in the first and second wavelength conversion units 171 and 172 according to an example embodiment of the present inventive concept.

Referring to the CIE 1931 color space chromaticity diagram illustrated in FIG. 26, white light generated by combining yellow, green, and red phosphors with a blue light emitting device or by combining a green light emitting device and a red light emitting device with a blue light emitting device, may have two or more peak wavelengths, and may be positioned in an area of segments connecting (x, y) coordinates (0.4476, 0.4074), (0.3484, 0.3516), (0.3101, 0.3162), (0.3128, 0.3292), (0.3333, 0.3333) of the CIE 1931 color space chromaticity diagram. Alternatively, the white light may be located in an area surrounded by the segments and a blackbody radiation spectrum. A color temperature of the white light may range from 2,000K to 20,000K. As illustrated in FIG. 26, white light adjacent to Point E (0.3333, 0.3333) below the blackbody radiation spectrum may be used as a light source for lighting, to create clearer viewing conditions for the naked eye while light having a yellow-based component is reduced. Thus, a lighting product using white light adjacent to Point E (0.3333, 0.3333), below the blackbody radiation spectrum, may be useful as lighting for a retail space in which consumer goods are sold, for example.

Various materials, such as a phosphor or a quantum dot (QD), may be used as a material for converting a wavelength of light emitted by the first to third semiconductor light emitting units LED1 to LED3 employed in an example embodiment.

The phosphor may have the following formulae and colors: yellow and green $Y_3Al_5O_{12}$:Ce, yellow and green $Tb_3Al_5O_{12}$:Ce, and yellow and green $Lu_3Al_5O_{12}$:Ce (oxide-based); yellow and green $(Ba,Sr)_2SiO_4$:Eu and yellow and orange $(Ba,Sr)_3SiO_5$:Ce (silicate-based); green $\beta$-SiAlON:Eu, yellow $La_3Si_6N_{11}$:Ce, orange $\alpha$-SiAlON:Eu, red $CaAlSiN_3$:Eu, red $Sr_2Si_5N_8$:Eu, red $SrSiAl_4N_7$:Eu, red $SrLiAl_3N_4$:Eu, and red $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$) (nitride-based), in which Ln may be at least one kind of element selected from the group consisting of group IIIa elements and rare earth elements, and M may be at least one kind of element selected from the group consisting of calcium (Ca), barium (Ba), strontium (Sr), and magnesium (Mg); and KSF-based red $K_2SiF_6$:$Mn_4^+$, KSF-based red $K_2TiF_6$:$Mn_4^+$, KSF-based red $NaYF_4$:$Mn_4^+$, KSF-based red $NaGdF_4$:$Mn_4^+$, and KSF-based red $K_3SiF_7$:$Mn^{4+}$ (fluoride-based) (for example, a composition ratio of Mn may satisfy $0 < z \leq 0.17$).

A phosphor composition may be required to conform with stoichiometry, and respective elements thereof may be replaced with other elements in each group in which a corresponding element is included from the periodic table. For example, strontium (Sr) may be substituted with barium (Ba), calcium (Ca), magnesium (Mg), or the like, of alkaline earth metals (group II), and yttrium (Y) may substituted with terbium (Tb), lutetium (Lu), scandium (Sc), gadolinium (Gd), or the like, of lanthanides. In addition, europium (Eu), an activator, or the like, may be substituted with cerium (Ce), terbium (Tb), praseodymium (Pr), erbium (Er), ytterbium (Yb), or the like, according to desired energy levels. An activator may be applied singly, or an additional sub-activator, or the like, may also be applied to modify characteristics.

In particular, the fluoride-based red phosphors may be coated with a fluoride not containing Mn, or may further include an organic coating on a surface coated with a fluoride not containing Mn, in order to improve reliability at high temperatures and high humidity. In the case of the fluoride-based red phosphor described above, since a narrow full width at half maximum (FWHM) less than or equal to 40 nm may be implemented, unlike with other phosphors, the fluoride-based red phosphor may be used for a high-resolution television, such as an ultra high definition (UHD) TV.

Table 1 below indicates types of phosphors by application fields of a light emitting device package using a blue LED chip (dominant wavelength: 440 nm to 460 nm) or an ultraviolet (UV) LED chip (dominant wavelength: 380 nm to 430 nm).

TABLE 1

| Use | Phosphor |
|---|---|
| LED TV BLU | $\beta$-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$($0.5 \leq x \leq 3$, $0 < z < 0.3$, $0 \leq y \leq 4$), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Lighting Device | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$($0.5 \leq x \leq 3$, $0 < z < 0.3$, $0 \leq y \leq 4$), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Side Viewing Screen (Mobile Device, Laptop PC, etc.) | Lu$_3$Al$_5$O$_{12}$:$Ce^{3+}$, Ca-$\alpha$-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$($0.5 \leq x \leq 3$, $0 < z < 0.3$, $0 \leq y \leq 4$), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |

TABLE 1-continued

| Use | Phosphor |
|---|---|
| Electronic Lighting Device (Headlamp, etc.) | $Lu_3Al_5O_{12}:Ce^{3+}$, $Ca-\alpha-SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$), $K_2TiF_6:Mn^{4+}$, $NaYF_4:Mn^{4+}$, $NaGdF_4:Mn^{4+}$, $K_3SiF_7:Mn^{4+}$ |

In addition, QD's may be used as wavelength conversion materials. Here, the QD's may replace phosphors, or may be mixed with phosphors.

Figure 27:
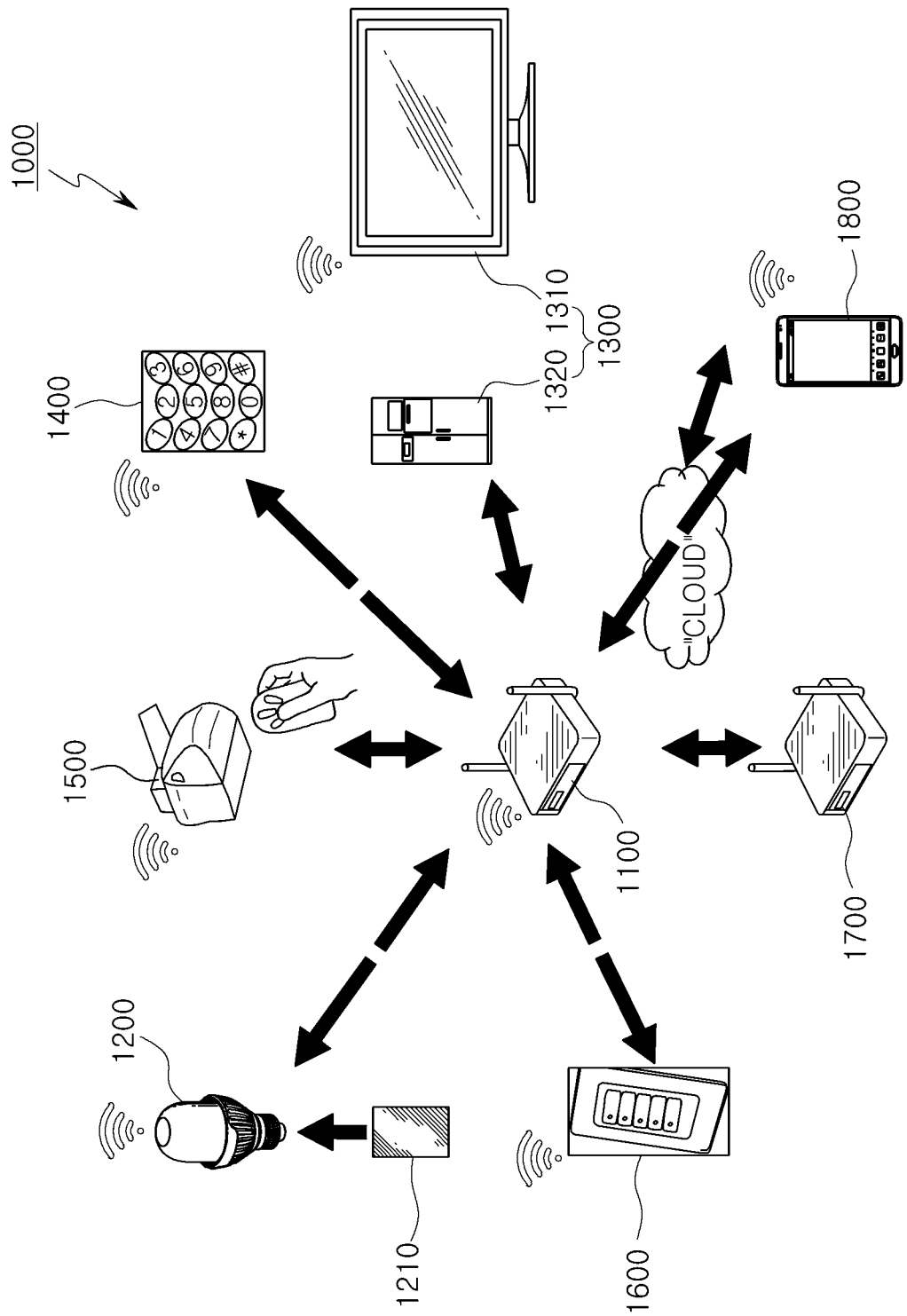
FIG. 27 is a view of an indoor smart network system in which a display panel according to an example embodiment of the present inventive concept may be employed.

FIG. 27 is a view of an indoor smart network system in which a display panel according to an example embodiment of the present inventive concept may be employed.

A network system 1000 according to an example embodiment may be a complex smart network system in which lighting technology, Internet of Things (IoT) technology, wireless communications technology, and the like, using a semiconductor light emitting device, such as an LED, converge. The network system 1000 may be implemented using a display panel according to an example embodiment described above, lighting devices and wired/wireless communications devices, or may be realized by using a sensor, a controller, a communications unit, software for network control and maintenance, or the like.

The network system 1000 may be applied to an open space, such as a park or a street, as well as to a closed space defined within a building, such as a home or an office. The network system 1000 may be implemented on the basis of an IoT environment to collect or process various pieces of information and provide the collected or processed information to a user. The LED lamp 1200 may function to check and control operational states of other devices 1300 to 1800 included in the IoT environment, on the basis of a function of the LED lamp 1200, such as visible light communications, as well as to receive information regarding surroundings from a gateway 1100 to control lighting of the LED lamp 1200 itself.

Referring to FIG. 27, the network system 1000 may include the gateway 1100 processing data transmitted and received over different communications protocols, the LED lamp 1200 connected to the gateway 1100 to communicate therewith and including an LED as a light source, and the devices 1300 to 1800 connected to the gateway 1100 to communicate therewith according to various wireless communications schemes. To realize the network system 1000 on the basis of the IoT environment, each of the devices 1300 to 1800, as well as the LED lamp 1200, may include at least one communications module. As an example, the LED lamp 1200 may be connected to the gateway 1100 to communicate therewith using a wireless communications protocol, such as wireless-fidelity (Wi-Fi), Zigbee®, or light-fidelity (Li-Fi), and to this end, the LED lamp 1200 may have at least one lamp communications module 1210.

As described above, the network system 1000 may be applied to an open space, such as a park or a street, as well as to a closed space, such as a home or an office. When the network system 1000 is applied to a home, the plurality of devices 1300 to 1800 included in the network system 1000 and connected to the gateway 1100 to communicate therewith on the basis of IoT technology may include home appliances 1300, a digital door lock 1400, a garage door lock 1500, a lighting switch 1600 installed on a wall or the like, a router 1700 for wireless network relay, and a mobile device 1800 such as a smartphone, a tablet PC, or a laptop PC.

In the network system 1000, the LED lamp 1200 may check operating states of the various devices 1300 to 1800, or may automatically control luminance of the LED lamp 1200 itself, according to surroundings or circumstances, using a wireless communications network (Zigbeem, Wi-Fi, Li-Fi, or the like) installed in a home. Further, use of Li-Fi communications using visible light emitted by the LED lamp 1200 may allow the devices 1300 to 1800 included in the network system 1000 to be controlled.

First, the LED lamp 1200 may automatically control the luminance of the LED lamp 1200 on the basis of information regarding surroundings transmitted from the gateway 1100 through the lamp communications module 1210, or information regarding circumstances collected by a sensor mounted in the LED lamp 1200. For example, brightness of the LED lamp 1200 may be automatically controlled according to a type of a program being broadcast on the television 1310 or brightness of an image. To this end, the LED lamp 1200 may receive operational information from the television 1310 by the lamp communications module 1210 connected to the gateway 1100. The lamp communications module 1210 may be integrally modularized with a sensor or a controller included in the LED lamp 1200.

For example, in a case in which a program broadcast on the television 1310 is a drama, a color temperature of illumination may be controlled to be less than or equal to 12,000K, such as 6,000K, according to predetermined settings to control colors, thereby creating a cozy atmosphere. In a different manner, when a program is a comedy, the network system 1000 may be configured in such a manner that a color temperature of illumination may be increased to 6,000K or more, and to be blue-based white lighting, according to predetermined settings.

When a certain period of time has elapsed after the digital door lock 1400 is locked while there is no person in a home, the network system 1000 may allow all LED lamps 1200 turned on to be turned off, thereby preventing wastage of electricity. Alternatively, in a case in which a security mode is set by the mobile device 1800, or the like, when the digital door lock 1400 is locked without a person in a home, the LED lamp 1200 may remain turned on.

Operations of the LED lamp 1200 may also be controlled according to information regarding circumstances collected by various types of sensors connected to the network system 1000. For example, when the network system 1000 is implemented within a building, a light, a position sensor, and a communications module may be combined with each other in the building to collect information on locations of people in the building so that the light may be turned on or off, or the collected information may be provided to a user in real time, thereby enabling facility management or efficient use of an idle space. In general, since a lighting device, such as the LED lamp 1200, may be disposed in almost all of the spaces on each floor of a building, various pieces of information within the building may be collected by a sensor integrated with the LED lamp 1200, and the collected information may be used again, for the management of facilities, the utilization of idle space, or the like.

Meanwhile, a combination of the LED lamp 1200 with an image sensor, a storage device, the lamp communications module 1210, and the like, may allow the LED lamp 1200 to be utilized as a device that may maintain building security or detect and deal with an emergency. For example, when a smoke or temperature sensor, or the like, is attached to the LED lamp 1200, a fire, or the like, may be promptly detected to significantly reduce damage. In addition, brightness of lighting may be controlled in consideration of external weather or an amount of sunshine, thus saving energy and providing a comfortable lighting environment.

As set forth above, according to example embodiments of the present inventive concept, a light emitting device package not requiring a separate thin film transistor (TFT) substrate, by disposing a switching unit for controlling a semiconductor light emitting device within a partition structure of a wavelength conversion unit, a method of manufacturing the light emitting device package, and a display apparatus using the light emitting device package, are provided.

While exemplary embodiments have been shown and described above, it will be apparent to those skilled in the art that modifications and variations could be made without departing from the scope of the present disclosure.

What is claimed is:

1. A method of manufacturing a light emitting device package comprising:
    forming a light emitting structure by stacking a first conductive semiconductor layer, an active layer, and a second conductive semiconductor layer on a substrate for growth;
    forming a plurality of semiconductor light emitting units by etching a region of the light emitting structure such that a separation region in which the substrate for growth is exposed is formed;
    forming a plurality of switching units by doping, with impurities, portions of the substrate for growth exposed by the separation region, each of the plurality of switching units including a source region and a drain region;
    forming a plurality of through holes, in which the light emitting structure is exposed, by etching portions of a region of the substrate for growth, corresponding to the plurality of semiconductor light emitting units; and
    forming a plurality of wavelength conversion units by filling the plurality of through holes with a wavelength conversion material.

2. The method of claim 1, further comprising: forming an insulating layer to cover the plurality of semiconductor light emitting units and the separation region before forming the plurality of switching units.

3. The method of claim 2, further comprising: forming a photoresist layer to cover the insulating layer and forming a plurality of openings in which the separation region is exposed.

4. The method of claim 3, wherein a doping region is formed by doping, with the impurities, the separation region exposed to a lower surface of each of the plurality of openings.

5. The method of claim 4, wherein the impurities are a p-type impurity, and the doping region is a p-well region.

6. The method of claim 5, further comprising: forming an n-well region by doping an n-type impurity before forming the p-well region.

7. The method of claim 1, wherein the forming the plurality of switching units includes:
    forming a source electrode and a drain electrode electrically connected to the source region and the drain region, respectively;
    forming a gate insulating layer on the source region and the drain region; and
    forming a gate electrode on the gate insulating layer.

8. The method of claim 6, wherein the insulating layer includes a material having the same composition as a composition of the gate insulating layer.

9. The method of claim 1, wherein each of the plurality of switching units is a field-effect transistor (FET).

10. The method of claim 1, wherein the forming the plurality of switching units includes:
    forming a plurality of first electrodes and a plurality of second electrodes respectively connected to a first conductive semiconductor layer and a second conductive semiconductor layer of each of the plurality of semiconductor light emitting units, the plurality of second electrodes extending to a source electrode of each of the plurality of switching units.

11. The method of claim 1, wherein the plurality of semiconductor light emitting units are parallel on the substrate for growth, and the plurality of switching units are parallel to the plurality of semiconductor light emitting units, respectively.

12. The method of claim 1, wherein an inner wall of at least one of the plurality of through holes has a protruding region.

13. The method of claim 12, wherein at least one of the plurality of switching units is formed in the protruding region.

14. The method of claim 1, wherein the substrate for growth includes a material containing Si.

15. A method of manufacturing a light emitting device package comprising:
    forming a plurality of semiconductor light emitting units spaced apart from each other by stacking a first conductive semiconductor layer, an active layer, and a second conductive semiconductor layer on a substrate for growth and by etching the substrate for growth to be exposed;
    forming an insulating layer to cover the plurality of semiconductor light emitting units and an exposed region of the substrate for growth;
    forming a plurality of switching units by doping, with impurities, certain portions of the exposed region of the substrate for growth, each of the plurality of switching units including a source region and a drain region;
    forming a plurality of through holes, in which the plurality of semiconductor light emitting units are respectively exposed, by etching portions of a region of the substrate for growth contacting the plurality of semiconductor light emitting units; and
    forming a plurality of wavelength conversion units by filling the plurality of through holes with a wavelength conversion material.

16. The method of claim 1, wherein the forming the plurality of switching units includes:
    forming a source electrode and a drain electrode electrically connected to the source region and the drain region, respectively;
    forming a gate insulating layer on the source region and the drain region; and
    forming a gate electrode on the gate insulating layer.

17. The method of claim 16, further comprising: forming a molding unit to cover the plurality of semiconductor light emitting units and the plurality of switching units.

18. A method of manufacturing a light emitting device package comprising:
    forming a first semiconductor light emitting unit, a second semiconductor light emitting unit, and a third semiconductor light emitting unit spaced apart from each other by stacking a first conductive semiconductor layer, an active layer, and a second conductive semiconductor layer on a substrate for growth and by etching the first conductive semiconductor layer, the active layer, and the second conductive semiconductor layer such that the substrate for growth is exposed;

forming an insulating layer to cover the first semiconductor light emitting unit, the second semiconductor light emitting unit, and the third semiconductor light emitting unit and an exposed region of the substrate for growth;

forming a first switching unit, a second switching unit, and a third switching unit by doping, with impurities, certain portions of the exposed region of the substrate for growth, each of the first switching unit, the second switching unit, and the third switching unit including a source region and a drain region;

forming a first through hole, a second through hole, and a third through hole, in which the first semiconductor light emitting unit, the second semiconductor light emitting unit, and the third semiconductor light emitting unit are respectively exposed, by etching portions of a region of the substrate for growth contacting the first semiconductor light emitting unit, the second semiconductor light emitting unit, and the third semiconductor light emitting unit; and forming a first wavelength conversion unit, a second wavelength conversion unit, and a third wavelength conversion unit by filling the first through hole, the second through hole, and the third through hole with a wavelength conversion material.

19. The method of claim 18, wherein the forming the first wavelength conversion unit, the second wavelength conversion unit, and the third wavelength conversion unit includes filling the first through hole, the second through hole, and the third through hole with wavelength conversion materials having different compositions, respectively.

20. The method of claim 19, wherein the active layer emits blue light, and each of the first wavelength conversion unit, the second wavelength conversion unit, and the third wavelength conversion unit converts blue light into one of red and green light.

\* \* \* \* \*